United States Patent
Sato et al.

(10) Patent No.: US 8,471,578 B2
(45) Date of Patent: Jun. 25, 2013

(54) PROBE AND METHOD OF MANUFACTURING PROBE

(75) Inventors: Koki Sato, Shinagwa (JP); Yasuyuki Miki, Tokyo (JP); Keita Harada, Tokyo (JP); Mitsuru Kobayashi, Tokyo (JP); Hideo Miyazawa, Tokyo (JP); Koki Takahashi, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 334 days.

(21) Appl. No.: 12/870,895

(22) Filed: Aug. 30, 2010

(65) Prior Publication Data

US 2011/0050263 A1   Mar. 3, 2011

(30) Foreign Application Priority Data

| Sep. 3, 2009 | (JP) | 2009-203849 |
| Sep. 30, 2009 | (JP) | 2009-228696 |
| Mar. 31, 2010 | (JP) | 2010-082699 |
| Jul. 14, 2010 | (JP) | 2010-160069 |

(51) Int. Cl.
*G01R 31/20* (2006.01)

(52) U.S. Cl.
USPC .................................................. 324/754.01

(58) Field of Classification Search
USPC ............... 324/754.01–754.3, 755.01–755.11, 324/762.01–762.1; 257/48; 438/14–18
See application file for complete search history.

(56) References Cited

U.S. PATENT DOCUMENTS 6,443,784 B1 *  9/2002  Kimoto ................... 439/862
7,474,110 B2 *  1/2009  Mochizuki et al. ...... 324/756.03

FOREIGN PATENT DOCUMENTS

| JP | 2007-024664 | 2/2007 |
| JP | 2007-071699 | 3/2007 |
| WO | WO 2009/084906 A2 | 7/2009 |

OTHER PUBLICATIONS

Office Action dated Oct. 20, 2011 issued with respect to the corresponding Korean Patent Application No. 10-2010-0085169.

* cited by examiner

*Primary Examiner* — Tung X Nguyen
(74) *Attorney, Agent, or Firm* — IPUSA, PLLC

(57) ABSTRACT

A probe is made to contact an electrode terminal in an electric circuit or an electronic part for an electric measurement of the electric circuit or the electronic part. The probe includes a terminal portion which is brought in contact with the electrode terminal at one end of the probe, a spring portion in which U-shaped unit portions are arrayed in a zigzag formation, and a housing portion which surrounds the spring portion. The probe is formed of a sheet of a sheet-metal plate which is bent multiple times, the sheet-metal plate having a predetermined configuration in which a portion corresponding to the terminal portion, a portion corresponding to the spring portion, and a portion corresponding to the housing portion are continuously linked together.

7 Claims, 54 Drawing Sheets

436

PROBE AND METHOD OF MANUFACTURING PROBE

BACKGROUND OF THE INVENTION

1. Field of the Invention

The present disclosure relates to a probe and a method of manufacturing the probe.

2. Description of the Related Art

In manufacturing semiconductor integrated circuits, a measuring instrument for measuring electric characteristics of semiconductor integrated circuits fabricated on a wafer is used. To perform electric measurement with this measuring instrument, a probe is brought in contact with an electrode pad or an electrode terminal formed on the wafer to establish electrical connection between the probe and the electrode pad or electrode terminal.

A coil spring probe is typically used as the probe of this type. The coil spring probe includes a coil spring provided in a cylindrical portion and one end of the coil spring corresponds to a contact terminal of the probe. The end (the contact terminal) of the coil spring in the coil spring probe is brought in contact with the electrode pad or electrode terminal fabricated on the wafer. The other end of the coil spring in the coil spring probe is electrically connected to the measuring instrument. In the coil spring probe, the coil spring is provided in the cylindrical portion thereof, and the contact terminal of the probe can be residually contracted or expanded to ensure the electrical connection between the probe and the electrode pad or electrode terminal fabricated on the wafer.

For example, Japanese Laid-Open Patent Publication No. 2007-024664 discloses a coil spring probe of the above type. Japanese Laid-Open Patent Publication No. 2007-071699 discloses a coil spring probe of the above type.

The coil spring probe according to the related art generally has a structure including the contact terminal, the coil spring, and the cylindrical portion. Usually, these components of the coil spring probe are individually produced as separate components and assembled together, thereby manufacturing the coil spring probe. For this reason, the manufacturing processes are complicated, which may increase the manufacturing time and cost.

SUMMARY OF THE INVENTION

In one aspect, the present disclosure provides a probe having a spring function and used for electrical connection which can be speedily manufactured with low cost.

In an embodiment which solves or reduces one or more of the above-described problems, the present disclosure provides a probe which is made to contact an electrode terminal in an electric circuit or an electronic part for an electric measurement of the electric circuit or the electronic part, the probe including: a terminal portion which is brought in contact with the electrode terminal at one end of the probe; a spring portion in which U-shaped unit portions are arrayed in a zigzag formation; and a housing portion which surrounds the spring portion, wherein the probe is formed of a sheet of a sheet-metal plate which is bent multiple times, the sheet-metal plate having a predetermined configuration in which a portion corresponding to the terminal portion, a portion corresponding to the spring portion, and a portion corresponding to the housing portion are continuously linked together.

In an embodiment which solves or reduces one or more of the above-described problems, the present disclosure provides a method of manufacturing a probe which is made to contact an electrode terminal in an electric circuit or an electronic part for an electric measurement of the electric circuit or the electronic part, the method including: a metal plate forming step of forming a sheet-metal plate having a predetermined configuration; a plating step of plating a surface of the sheet-metal plate having the predetermined configuration; and a bending step of bending the sheet-metal plate the surface of which is plated, wherein, in the sheet-metal plate having the predetermined configuration, a portion corresponding to a terminal portion of the sheet metal plate which is brought in contact with the electrode terminal, a portion corresponding to a spring portion of the sheet metal plate in which U-shaped unit portions are arrayed in a zigzag formation, and a portion corresponding to a housing portion of the sheet metal plate which surrounds the spring portion are continuously linked together.

Other objects, features and advantages of the present disclosure will become more apparent from the following detailed description when read in conjunction with the accompanying drawings.

DETAILED DESCRIPTION OF THE PREFERRED EMBODIMENTS

A description will be given of embodiments of the present disclosure with reference to the drawings.

A probe of a first embodiment of the present disclosure will be described.

The probe of this embodiment is used for inspecting an electronic part, an electric circuit, etc. The probe of this embodiment is electrically connected to an electrode pad or an electrode terminal formed on the electronic part, the electric circuit, etc.

Figure 1:
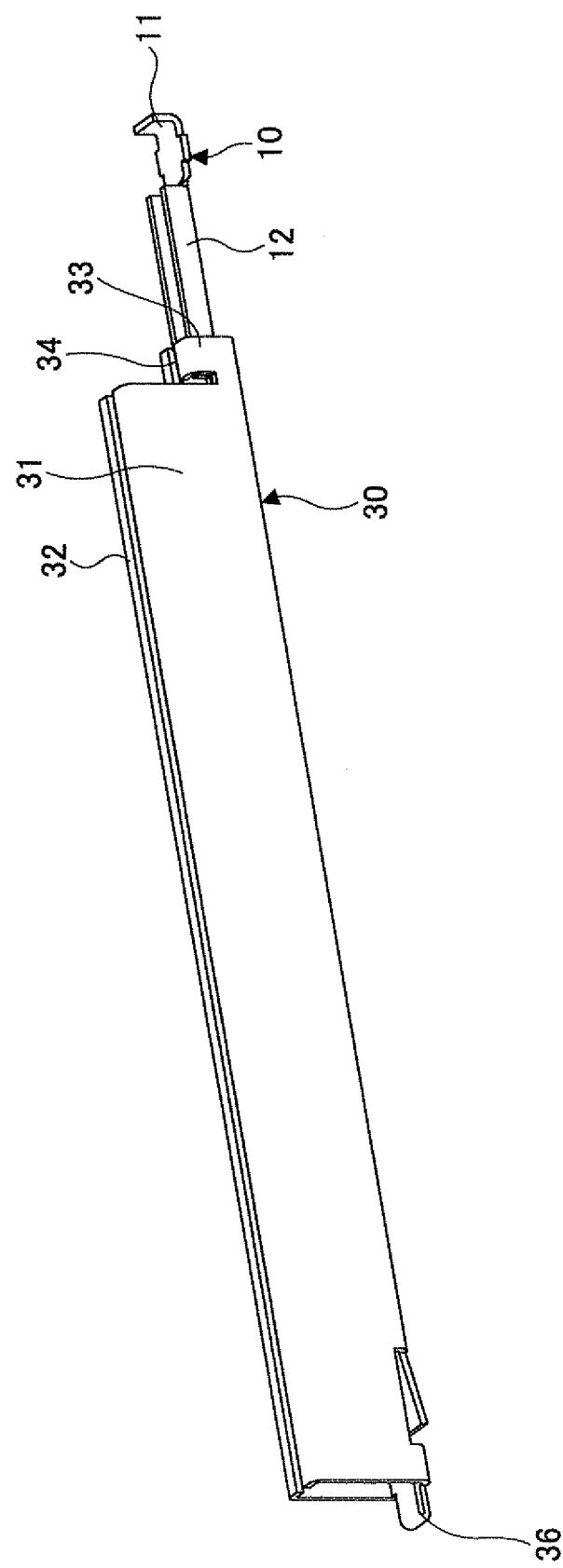
FIG. 1 is a perspective view of a probe of a first embodiment of the present disclosure.
Figure 2:
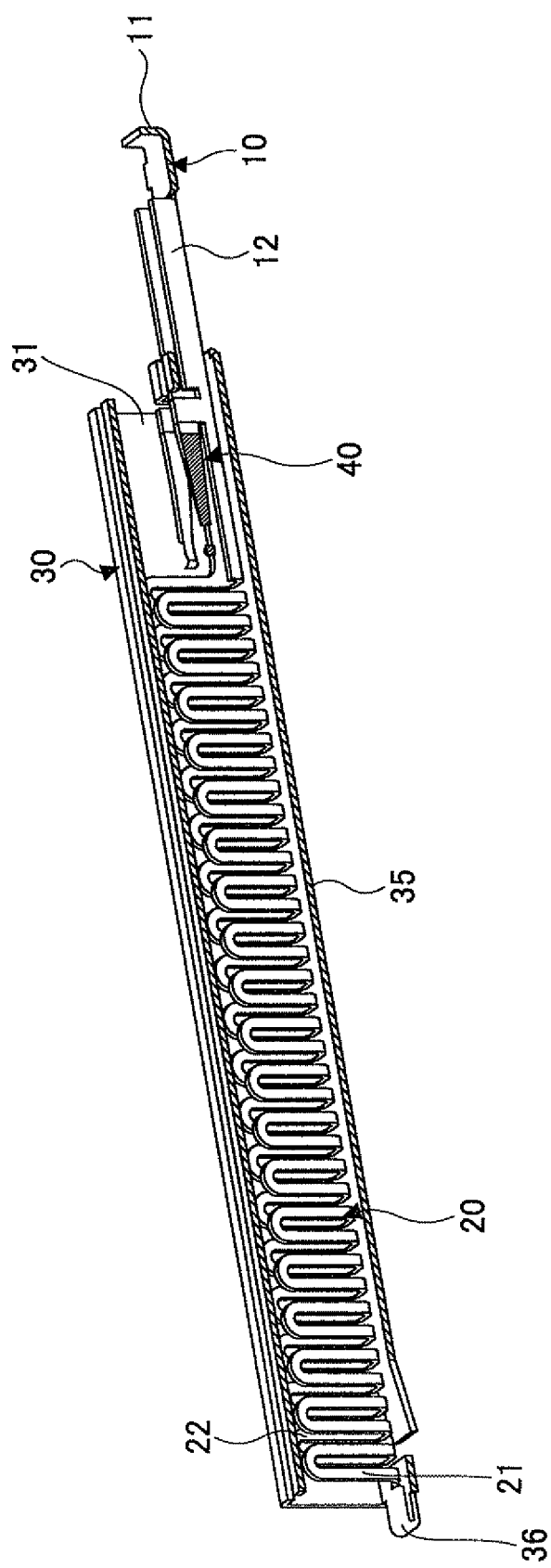
FIG. 2 is a perspective view of an internal structure of the probe of the first embodiment.

Specifically, as illustrated in FIG. 1 and FIG. 2, the probe of this embodiment is formed by press forming (punching and bending) one sheet of a sheet-metal plate which is made of copper or an alloy containing copper. Therefore, the probe of this embodiment has a unified configuration in which the components of the probe are continuously linked together.

The probe of this embodiment is constituted to include a terminal portion 10, a spring portion 20, a housing portion 30, and a housing connecting portion 40.

In this embodiment, the terminal portion 10 is to be in contact with an electrode pad or an electrode terminal of an electric circuit or an electronic part fabricated on a wafer to establish electrical connection between the probe and the electric circuit or the electronic part. One end of the terminal portion 10 is bent in an L-shaped formation to form a terminal contact portion 11. This terminal contact portion 11 is brought in contact with the electrode pad or the electrode terminal of the electric circuit or the electronic part, which is the object of inspection, to establish electrical connection of the probe and the electrode pad or the electrode terminal.

Side portions on both sides of the terminal portion 10 are bent in an L-shaped formation along the longitudinal direction of the terminal portion 10 to form head-end reinforcing portions 12. With the head-end reinforcing portions (which are formed by bending the side portions of the terminal portion 10 in an L-shaped formation), when the terminal portion 10 is made to contact the electrode pad or the electrode terminal causing external force to be exerted on the terminal portion 10, the terminal contact portion 11 can be reliably made to contact the electrode pad or the electrode terminal without deforming the terminal portion 10.

In this embodiment, the head-end reinforcing portions 12 are formed to have a rectangular cross-section by bending the side portions of the terminal portion 10 in an L-shaped formation. Alternatively, the head-end reinforcing portions 12 may be formed to have a V-shaped cross-section by bending the central area thereof or may be formed to have a U-shaped or semicircular cross-section by forming a curved surface thereon.

The spring portion 20 has a configuration which is formed by bending a sheet-metal plate with U-shaped unit portions being arrayed in the longitudinal direction in a zigzag formation, along two longitudinal lines of the spring portion 20 to have a rectangular cross-section, and one side portion 21 and the other side portion 22 of the spring portion 20 which are formed as a result of the bending are substantially parallel to each other.

In this embodiment, the spring portion 20 is formed to have a rectangular cross-section. Alternatively, the spring portion 20 may be formed to have a U-shaped cross-section.

The spring portion 20 in this embodiment has the configuration in which the U-shaped unit portions are arrayed on the sides thereof in a zigzag formation, and the spring portion 20 has elasticity and functions as a spring that can be resiliently deformed.

The housing portion 30 is formed to surround the whole spring portion 20 by bending the portion of the sheet metal plate corresponding to the housing portion 30 of the probe. Specifically, the portion of the sheet metal plate corresponding to the housing portion 30 is bent along two bending lines to form a side portion 31 and an upper face portion 32. The portion of the sheet metal plate which is folded back to the vicinity of the terminal portion 10 is also bent along the two bending lines to form a side portion 33 and an upper face portion 34 which surround a part of the head-end reinforcing portion 12 in the terminal portion 10.

At this time, the lower face portion 35 is also formed simultaneously with the forming of the side portion 31 and the side portion 33, so that the whole spring portion 20 may be surrounded by the housing portion 30 having a generally rectangular cross-section. The housing portion 30 and the spring portion 20 are bent by about 180 degrees at a curved portion 36 corresponding to the boundary therebetween and accommodated in the housing portion 30 of the spring portion 20. This curved portion 36 is electrically connected to the measuring instrument, such as a prober, and an electrode signal obtained when the terminal contact portion 11 is brought in contact with the electrode pad or the electrode terminal is transmitted to the measuring instrument via the curved portion 36.

In this embodiment, the housing terminal portion 40 is in contact with the internal walls of the side portions 31 of the housing portion 30, and the housing connecting portion 40 and the housing portion 30 are electrically connected to each other. Specifically, the housing connecting portion 40 and the housing portion 30 are electrically connected to each other, and an electrical signal from the terminal contact portion 11 is transmitted to the curved portion 36 via the terminal portion 10, the housing connecting portion 40, and the housing portion 30. Because the housing portion 30 has a large cross-sectional area in the portion through which the electrical signal flows, the electric resistance from the terminal contact portion 11 to the curved portion 36 can be lowered. Therefore, the electrical signal from the terminal contact portion 11 can be transmitted to the curved portion 36 with a low resistance.

Figure 3:
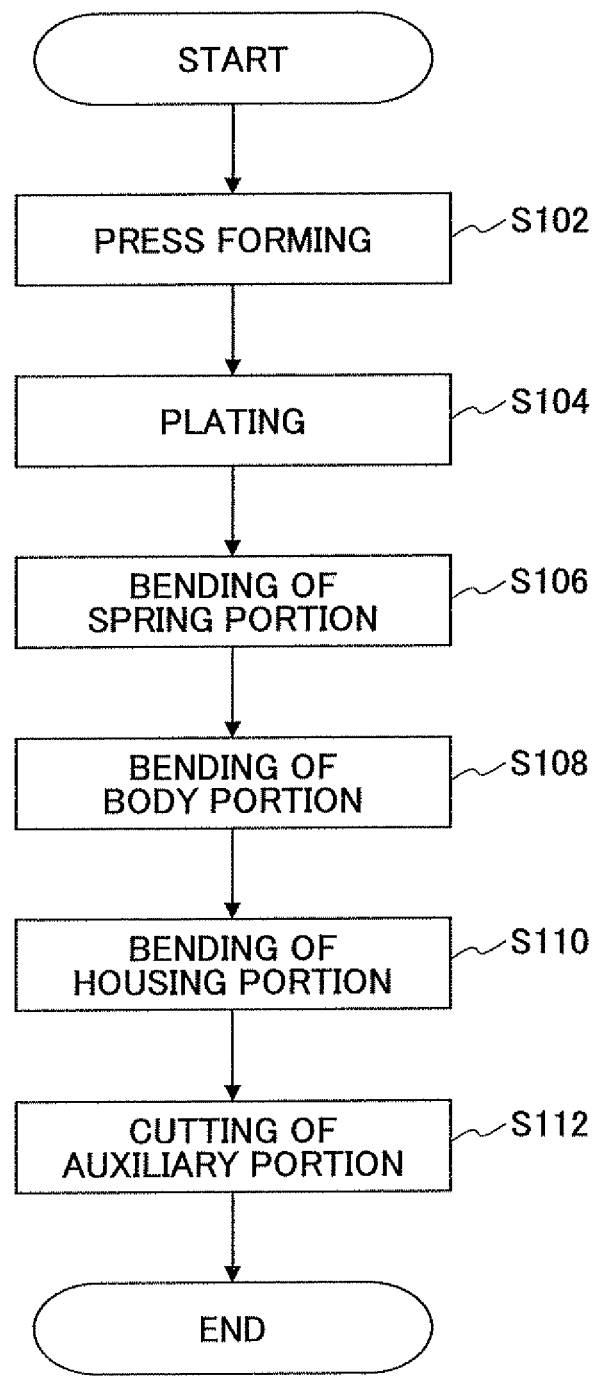
FIG. 3 is a flowchart for explaining a method of manufacturing the probe of the first embodiment.

Next, a method of manufacturing the probe of this embodiment will be described with reference to FIG. 3.

Upon start of the method of manufacturing the probe of this embodiment, in step S102, a sheet metal plate having a predetermined configuration is formed (metal plate forming step). The sheet metal plate having the predetermined configuration may be formed by either press forming or etching. In the press forming method, the sheet metal plate having the predetermined configuration is formed by press forming a blank sheet metal plate. In the etching method, a mask of a predetermined configuration is formed on a portion of a blank sheet metal plate and the remaining portion of the blank sheet metal plate on which the mask is not formed is etched so that the sheet metal plate having the predetermined configuration is formed.

The sheet metal plate is made of copper or an alloy containing copper, and a thickness of the sheet metal plate is in a range of 30 micrometers-150 micrometers. In this embodiment, the sheet metal plate having the predetermined configuration is formed by press forming a blank sheet metal plate of copper having a thickness of 60 micrometers.

Figure 4:
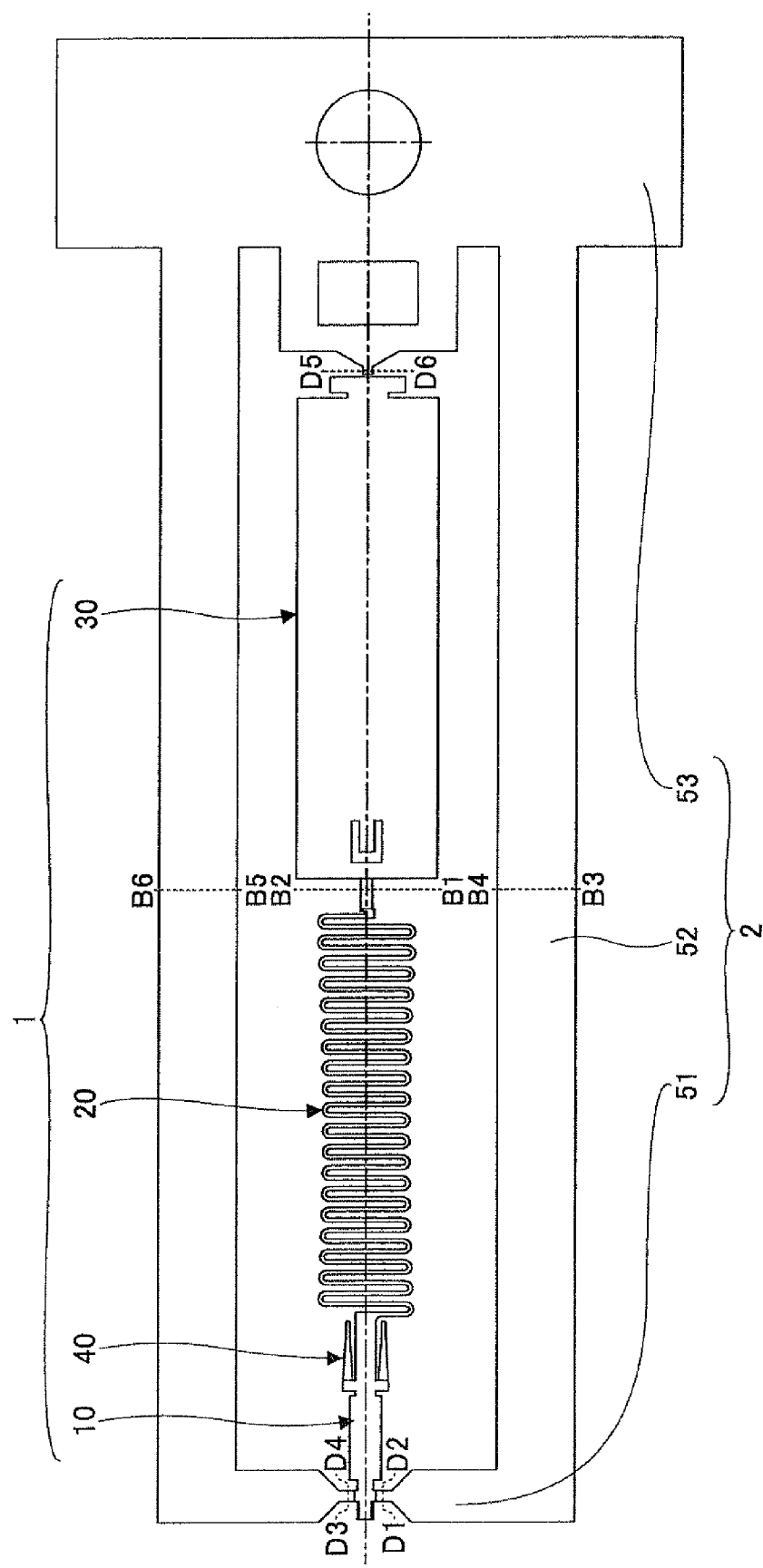
FIG. 4 is a diagram for explaining the method of manufacturing the probe of the first embodiment.

FIG. 4 illustrates an example of the sheet metal plate which is formed to have the predetermined configuration. The sheet metal plate of FIG. 4 includes a main body portion 1 which is provided to form the probe of this embodiment and a manufacture auxiliary portion 2. The main body portion 1 includes the terminal portion 10, the spring portion 20, the housing portion 30, and the housing connecting portion 40, which are formed in the non-bent condition prior to the subsequent bending steps.

In the following, the terminal portion 10, the spring portion 20, the housing portion 30, and the housing connecting portion 40 which are in the non-bent condition will be referred to as the portion of the sheet metal plate corresponding to the terminal portion 10, the portion of the sheet metal plate corresponding to the spring portion 20, the portion of the sheet metal plate corresponding to the housing portion 30, and the portion of the sheet metal plate corresponding to the housing connecting portion 40, respectively.

The manufacture auxiliary portion 2 is formed to surround the whole main body portion 1. The manufacture auxiliary portion 2 includes a pair of reinforcement terminal portions 51 which are connected to the terminal portion 10, a pair of side portions 52 which are formed on both sides of the main body portion 1 along the longitudinal direction of the main body portion 1, and a reinforcement main portion 53 which is connected to the end of the housing portion 30.

Figure 5:
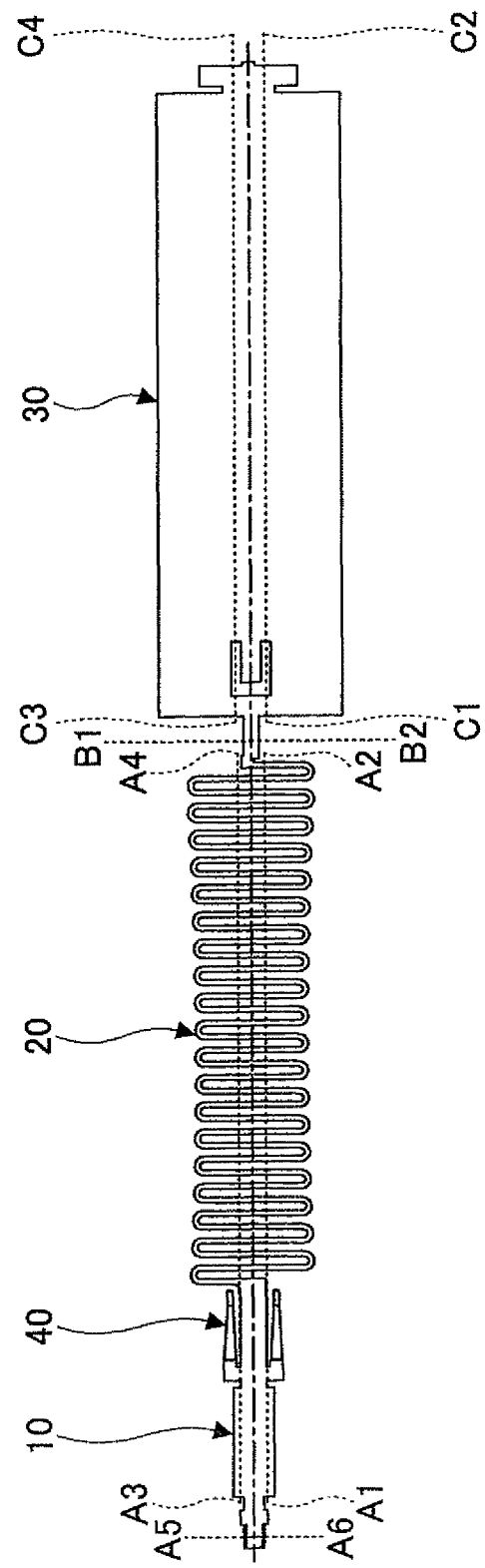
FIG. 5 is a diagram for explaining the method of manufacturing the probe of the first embodiment.

FIG. 5 illustrates an example of the main body portion 1 in the punched condition obtained as a result of the press forming. The main body portion 1 is constituted to include the portion of the sheet metal plate corresponding to the terminal portion 10, the portion of the sheet metal plate corresponding to the housing connecting portion 40, the portion of the sheet metal plate corresponding to the spring portion 20, and the portion of the sheet metal plate corresponding to the housing portion 30, which are continuously linked in this order from one end (on the left-hand side of FIG. 5) of the main body portion 1. The main body portion 1 is provided for forming the probe of this embodiment, and the probe of this embodiment is produced by bending the main body portion 1 multiple times.

Subsequently, in step S104, the main body portion 1 is plated (plating step). Because the manufacture auxiliary portion 2 is connected to the main body portion 1, the manufacture auxiliary portion 2 is also plated simultaneously when the main body portion 1 is plated. This plating step is done by sequentially performing plating of Ni (nickel), plating of Pd (palladium), and plating of Au (gold) in this order. Alternatively, the plating step may be done by sequentially performing plating of Ni and plating of Au in this order.

Subsequently, in step S106, the portion of the sheet metal plate corresponding to the spring portion 20 is bent (first bending step). Specifically, the portion of the sheet metal plate corresponding to the spring portion 20 is bent by 90 degrees along the dotted line A1-A2 illustrated in FIG. 5, and further bent by 90 degrees along the dotted line A3-A4 in the same direction. Thereby, the portion of the sheet metal plate corresponding to the spring portion 20 is bent to have a rectangular cross-section.

Figure 6:
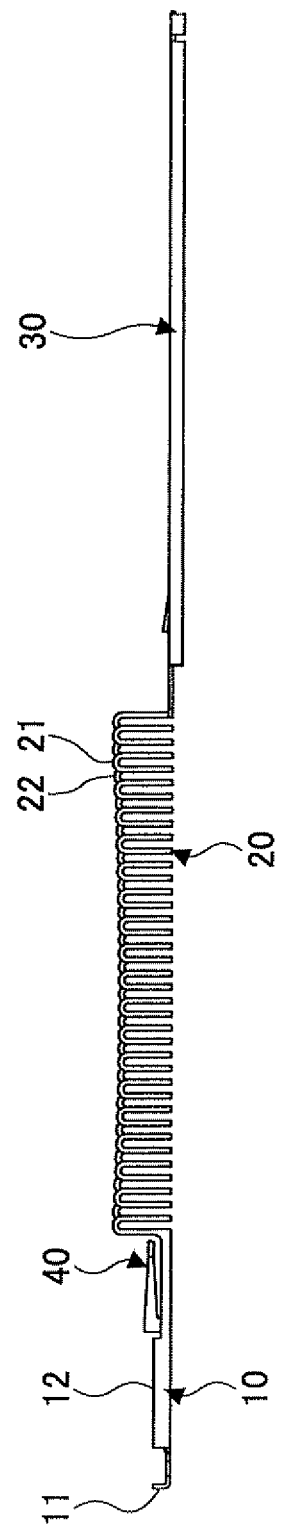
FIG. 6 is a side view of the probe in the middle of the method of manufacturing the probe of the first embodiment.
Figure 7:
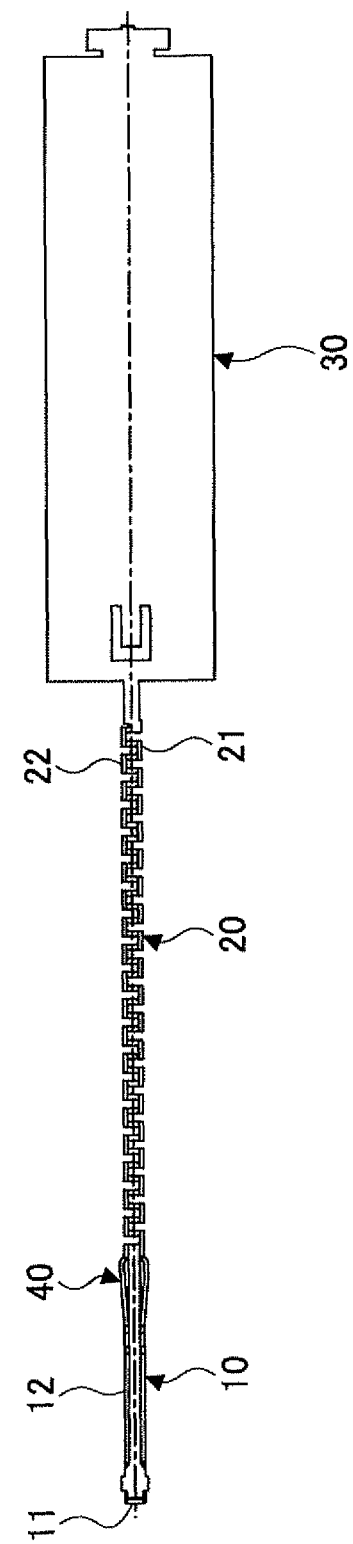
FIG. 7 is a top view of the probe in the middle of the method of manufacturing the probe of the first embodiment.
Figure 8:
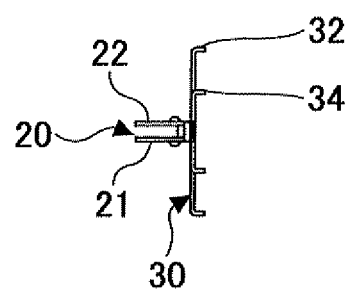
FIG. 8 is a front view of the probe in the middle of the method of manufacturing the probe of the first embodiment.

FIG. 6, FIG. 7 and FIG. 8 illustrate the appearance of the probe in which the main body portion 1 is bent in step S106. FIG. 6 is a side view of the probe, FIG. 7 is a top view of the probe, and FIG. 8 is a front view of the probe. As illustrated, the portion of the sheet metal plate corresponding to the spring portion 20 is bent to have a rectangular cross-section, and the surface formed by one side portion 21 of the spring portion 20 and the surface formed by the other side portion 22 of the spring portion 20 are substantially in parallel with each other. At this time, the side portions on both the sides of the terminal portion 10 are simultaneously bent by 90 degrees to form the head-end reinforcing portion 12, and the portion of the sheet metal plate corresponding to the housing connecting portion 40 has a configuration which is in conformity with the configuration of the side portion 21 and the side portion 22 of the spring portion 20. Moreover, the portion of the sheet metal plate corresponding to the spring portion 20 is bent by 90 degrees along the dotted line A5-A6 illustrated in FIG. 5 to form the terminal contact portion 11.

In the step S106, the side portions of the portion of the sheet metal plate corresponding to the housing portion 30 are bent by 90 degrees in the direction which is opposite to the direction in which the spring portion 20 is bent, so that the portions of the sheet metal plate corresponding to the upper face portion 32 and the upper face portion 34 are formed. Moreover, the housing connecting portion 40 is slightly bent outside so that the housing connecting portion 40 and the internal wall of the housing portion 30 are in contact with each other.

Subsequently, in step S108, the main body portion 1 is bent (second bending step). Specifically, the main body portion 1 is bent by 180 degrees along the dotted line B1-B2 illustrated in FIG. 5, to the side in which the spring portion 20 is bent. The portion bent along the dotted line B1-B2 constitutes the curved portion 36, and this curved portion 36 corresponds to a connection terminal when the probe of this embodiment is connected to the measuring instrument.

At this time, the manufacture auxiliary portion 2 is formed simultaneously. Specifically, as illustrated in FIG. 4, when the main body portion 1 is bent along the dotted line B1-B2, the manufacture auxiliary portion 2 is bent along the dotted line B3-B4 and the dotted line B5-B6 simultaneously. The dotted line B3-B4 and the dotted line B5-B6 exist on an extended line of the dotted line B1-B2. Thus, the main body portion 1 and the manufacture auxiliary portion 2 are bent simultaneously, and the main body portion 1 can be reliably bent along the dotted line B1-B2 with sufficient accuracy. The configuration of the probe of this embodiment in which the main body portion 1 is bent along the dotted line B1-B2 can be maintained.

Subsequently, in step S110, the portion of the sheet metal plate corresponding to the housing portion 30 is bent (third bending step). Specifically, the portion of the sheet metal plate corresponding to the housing portion 30 is bent by 90 degrees along the dotted line C1-C2 illustrated in FIG. 5 in a direction that is the same as the direction in which the spring portion 20 is bent, and bent by 90 degrees along the dotted line C3-C4, to form the side portion 31 and the side portion 33 of the housing portion 30. At this time, the lower face portion 35 is also formed simultaneously. The probe in this condition has a configuration in which the whole spring portion 20 is surrounded by the housing portion 30. The internal wall of the side portion 31 of the housing portion 30 and the housing connecting portion 40 are in contact with each other, and electrical connection therebetween is established.

Subsequently, in step S112, the main body portion 1 and the manufacture auxiliary portion 2 are cut off (manufacture auxiliary portion cutting step). Specifically, the main body portion 1 and the manufacture auxiliary portion 2 are cut off along the dotted line D1-D2, the dotted line D3-D4, and the dotted line D5-D6 as illustrated in FIG. 4, respectively. Accordingly, the probe of this embodiment can be manufactured.

As described above, the probe of this embodiment can be manufactured by press forming one sheet of a sheet-metal plate. It is not necessary to perform an assembly process in which two or more components are assembled together, in order to manufacture the probe having a spring function. The probe manufacturing method includes only the press forming of the sheet-metal plate, the plating thereof, the bending thereof, and the cutting thereof. Hence, the probe can be manufactured using simple manufacturing equipment, and the probe manufacturing method itself is simple. It is possible to manufacture a large number of probes speedily with low cost. Therefore, the probe having a spring function can be manufactured with low cost.

Next, a probe of a second embodiment of the present disclosure will be described.

The probe of this embodiment is manufactured according to the method that is the same as that of the first embodiment, and the housing portion of the sheet metal plate of this embodiment is formed to have a generally square cross-section. If plural probes of this embodiment are arranged in the measuring instrument, such as a prober, in a two-dimensional formation, the housing portion of each probe is formed to have a generally square cross-section and the plural probes can be arranged at equal intervals with high density.

Figure 9:
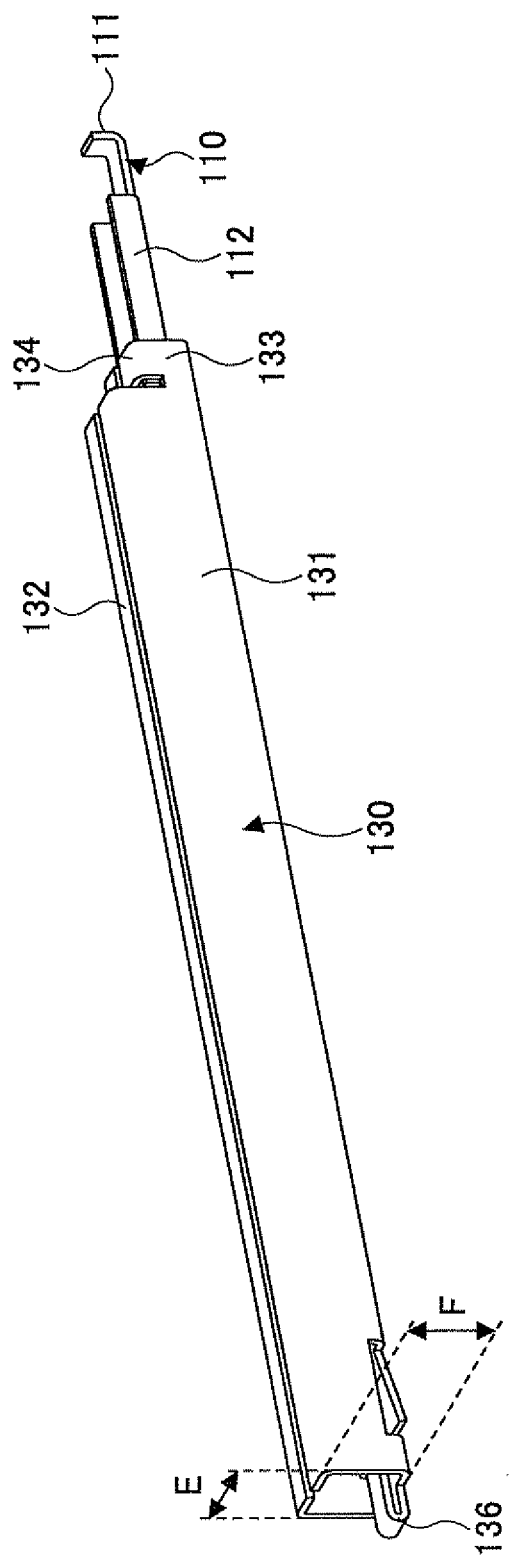
FIG. 9 is a perspective view of a probe of a second embodiment of the present disclosure.
Figure 10:
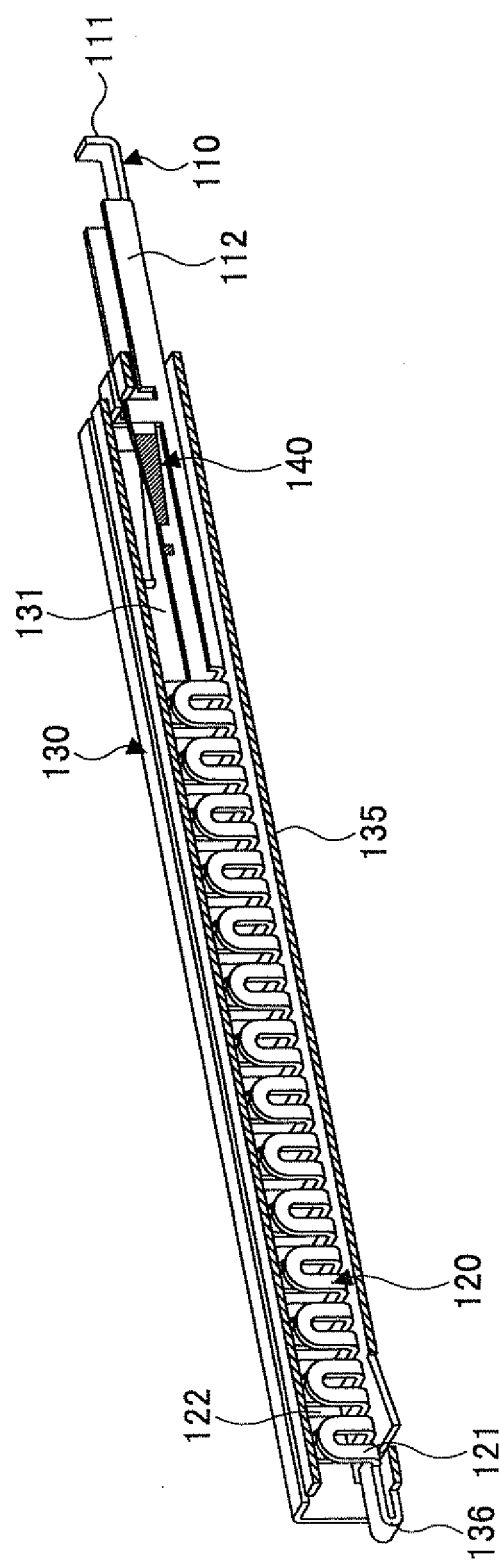
FIG. 10 is a perspective view of an internal structure of the probe of the second embodiment.

The probe of this embodiment will be described with reference to FIG. 9 and FIG. 10. Similar to the probe of the first embodiment, the probe of this embodiment is formed by bending one sheet of a sheet metal plate having a predetermined configuration, which metal plate is formed by punching a blank sheet metal plate made of copper or an alloy containing copper. Therefore, the probe of this embodiment has a unified configuration in which the components of the probe are continuously linked together.

The probe of this embodiment is constituted to include a terminal portion 110, a spring portion 120, a housing portion 130, and a housing connecting portion 140.

In this embodiment, the terminal portion 110 is to be in contact with an electrode pad or an electrode terminal of an electric circuit or an electronic part fabricated on a wafer to establish electrical connection between the probe and the electric circuit or the electronic part. One end of the terminal portion 110 is bent in an L-shaped formation to form a terminal contact portion 111. This terminal contact portion 111 is brought in contact with the electrode pad or the electrode terminal of the electric circuit or the electronic part, which is the object of inspection, to establish electrical connection between the probe and the electrode pad or the electrode terminal.

Side portions of the terminal portion 110 are bent in an L-shaped formation along the longitudinal direction of the terminal portion 110 to form head-end reinforcing portions 112. With the head-end reinforcing portions 112 (which are formed by bending the side portions of the terminal portion 110 in an L-shaped formation), when contacting the terminal portion 110 to the electrode pad or the electrode terminal causing external force to be exerted on the terminal portion 110, the terminal portion 110 can be reliably made to contact the electrode pad or the electrode terminal without deforming the terminal portion 110.

In this embodiment, the head-end reinforcing portions 112 are formed to have a rectangular cross-section by bending the side portions of the terminal portion 110 in an L-shaped formation. Alternatively, the head-end reinforcing portions 112 may be formed to have a V-shaped cross-section by bending the central area thereof or may be formed to have a U-shaped or semicircular cross-section by forming a curved surface thereon.

The spring portion 120 has a configuration which is formed by bending a sheet-metal plate with U-shaped unit portions being arrayed in the longitudinal direction in a zigzag formation, along two longitudinal lines of the spring portion 120 to have a generally rectangular cross-section, and one side portion 121 and the other side portion 122 of the spring portion 120 which are formed as a result of the bending are substantially parallel to each other.

In this embodiment, the spring portion 120 is formed to have a rectangular cross-section. Alternatively, the spring portion 120 may be formed to have a U-shaped cross-section.

The spring portion 120 in this embodiment has the configuration in which the U-shaped unit portions are arrayed on the sides thereof in a zigzag formation, and the spring portion 120 has elasticity and functions as a spring that can be resiliently deformed.

The housing portion 130 is formed to surround the whole spring portion 120 by bending the portion of the sheet metal plate corresponding to the housing portion 130. Specifically, the portion of the sheet metal plate corresponding to the housing portion 130 is bent along two bending lines to form a side portion 131 and an upper face portion 132. The portion of the sheet metal plate which is folded back to the vicinity of the terminal portion 110 is also bent along the two being lines to form a side portion 133 and an upper face portion 134 which surround a part of the head-end reinforcing portion 112 in the terminal portion.

At this time, the lower face portion 135 is also formed simultaneously with the forming of the side portion 131 and the side portion 133, so that the whole spring portion 120 may be surrounded by the housing portion 130 having a generally square cross-section. The housing portion 130 and the spring portion 120 are bent by about 180 degrees at a curved portion 136 corresponding to the boundary therebetween and accommodated in the housing portion 130 of the spring portion 120. This curved portion 136 is electrically connected to the measuring instrument, such as a prober, and an electrode signal obtained when the terminal contact portion 111 is brought in contact with the electrode pad or the electrode terminal is transmitted to the measuring instrument via the curved portion 136.

In this embodiment, the housing connecting portion 140 is in contact with the internal wall of the side portion 131 of the housing portion 130 to establish electrical connection between the housing connecting portion 140 and the housing portion 130. Specifically, the housing connecting portion 140 and the housing portion 130 are electrically connected to each other and an electrical signal from the terminal contact portion 111 is transmitted to the curved portion 136 via the terminal portion 110, the housing connecting portion 140, and the housing portion 130. Because the housing portion 130 has a large cross-sectional area in the portion through which the electrical signal flows, the electric resistance from the terminal contact portion 111 to the curved portion 136 can be lowered. Therefore, the electrical signal from the terminal contact portion 111 can be transmitted to the curved portion 136 with a low resistance.

In the probe of this embodiment, the housing portion 130 is formed to have a generally square cross-section. Specifically, the housing portion 130 is formed so that a width E and a height F of the housing portion 130 as illustrated in FIG. 9 are substantially equal to each other. Thereby, plural probes of this embodiment can be arranged at equal intervals in a two-dimensional formation. The curved portion 136 is electrically connected to the measuring instrument, such as a prober. The method of manufacturing the probe of this embodiment is essentially the same as that of the first embodiment.

Next, a probe of a third embodiment of the present disclosure will be described. In the probe of this embodiment, the portion of the sheet metal plate corresponding to the spring portion is not bent, unlike the first and second embodiments described above.

Figure 11:
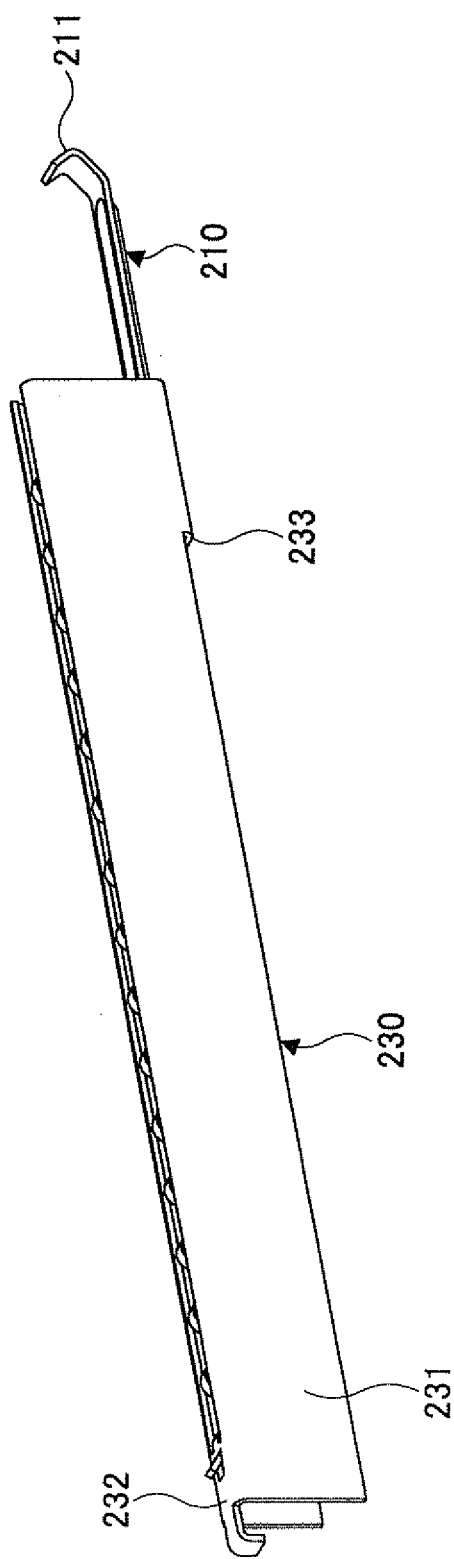
FIG. 11 is a perspective view of a probe of a third embodiment of the present disclosure.
Figure 12:
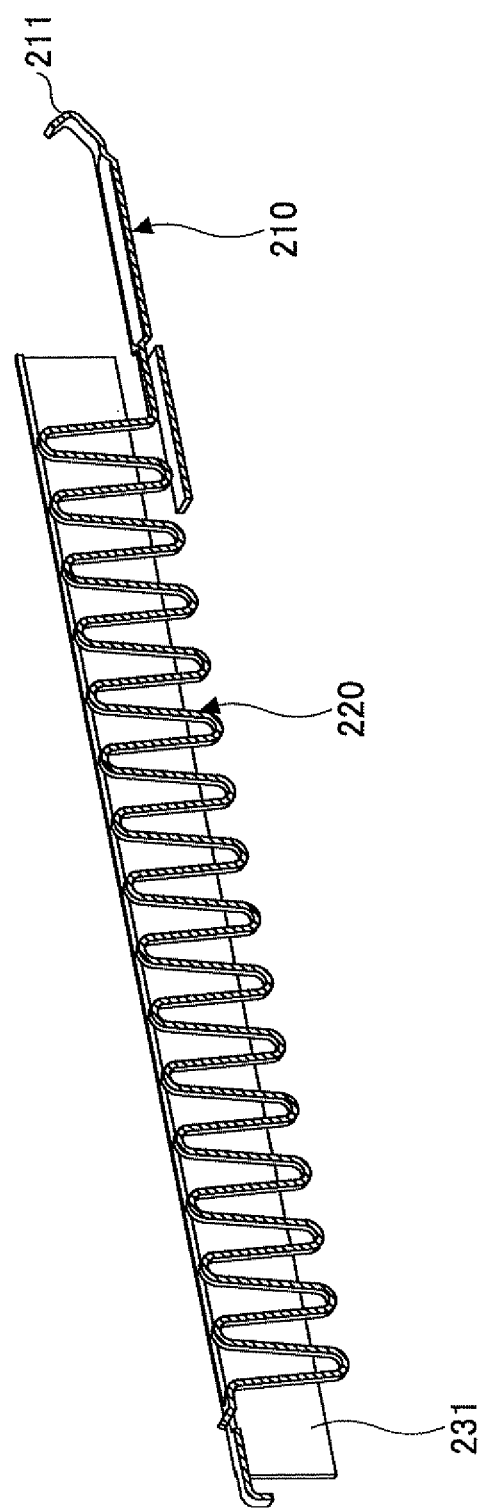
FIG. 12 is a perspective view of an internal structure of the probe of the third embodiment.

The probe of this embodiment will be described with reference to FIG. 11 and FIG. 12. The probe of this embodiment is constituted to include a terminal portion 210, a spring portion 220, and a housing portion 230.

The terminal portion 210 is to be in contact with an electrode pad or an electrode terminal of an electric circuit or an electronic part fabricated on a wafer to establish electrical connection between the probe and the electric circuit or the electronic part. One end of the terminal portion 210 is bent to form a terminal contact portion 211.

The spring portion 220 has a configuration in which U-shaped unit portions are arrayed in a linear formation. The spring portion 220 has elasticity and functions as a spring that can be resiliently deformed in the longitudinal direction in which the terminal portion 210 extends.

The housing portion 230 is formed to surround the side faces of the spring portion 220 and constituted to include two side portions 231, an upper face portion 232, and a lower face portion 233. The two side portions 231, the upper face portion 232, and the lower face portion 233 are formed by bending one sheet of the sheet metal plate.

Next, a probe of a fourth embodiment of the present disclosure will be described. The probe of this embodiment has a configuration in which a configuration of a terminal contact portion differs from those of the first to third embodiments described above. Specifically, each of the terminal contact portions 11, 111 and 211 in the first to third embodiments are formed by bending a sheet metal plate, but the terminal contact portion in this embodiment is formed without bending a sheet metal plate.

Figure 13:
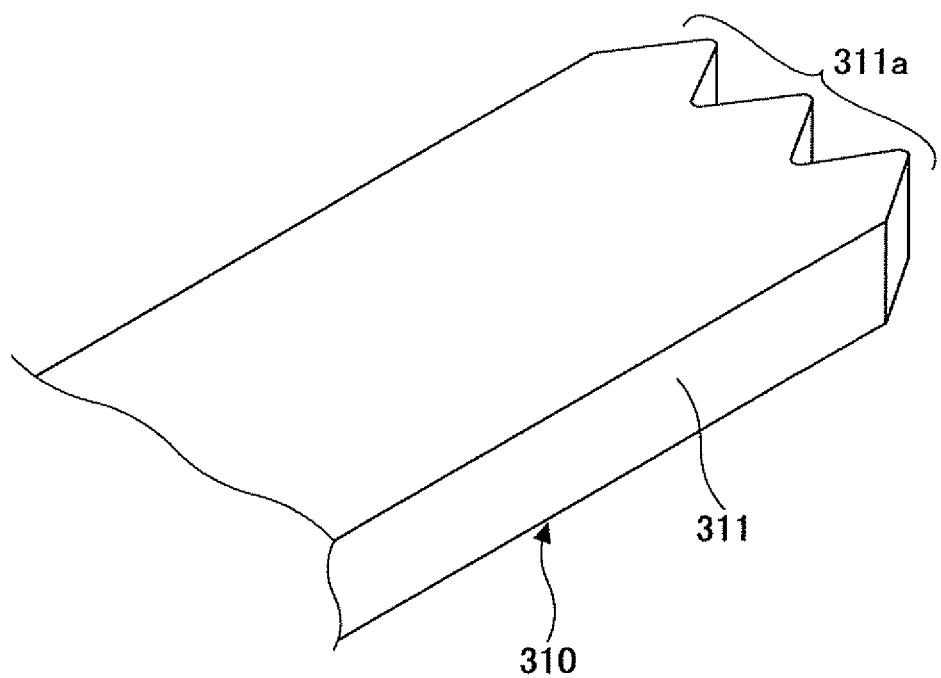
FIG. 13 is a perspective view of a terminal portion of a probe of a fourth embodiment of the present disclosure.

FIG. 13 illustrates a terminal portion 310 of the probe of this embodiment. In the terminal portion 310 of the probe of this embodiment, a crest-like portion 311a is formed at the head end of the terminal contact portion 311. The crest-like portion 311a may include two or more crest-shaped portions as illustrated in FIG. 13. This crest-like portion 311a may be formed simultaneously with the forming of a metal plate having a predetermined configuration by the press forming of a blank sheet metal plate as in the sheet metal plate forming step of the first embodiment.

In this embodiment, it is not necessary to bend the sheet metal plate in order to form the terminal contact portion, and the number of the manufacturing processes can be reduced and the probe of this embodiment can be manufactured speedily. It is possible to provide a probe having a spring function and used for electrical connection which can be speedily manufactured with low cost.

The configuration of the probe of this embodiment other than the terminal contact portion 311 is essentially the same as those of the first embodiment to the third embodiments described above.

Next, a probe of a fifth embodiment of the present disclosure will be described. Similar to the probe of the first embodiment, the probe of this embodiment is used for inspecting an electronic part or an electric circuit, and the probe of this embodiment is electrically connected to an electrode pad or an electrode terminal formed in the electronic part or the electric circuit.

Figure 14:
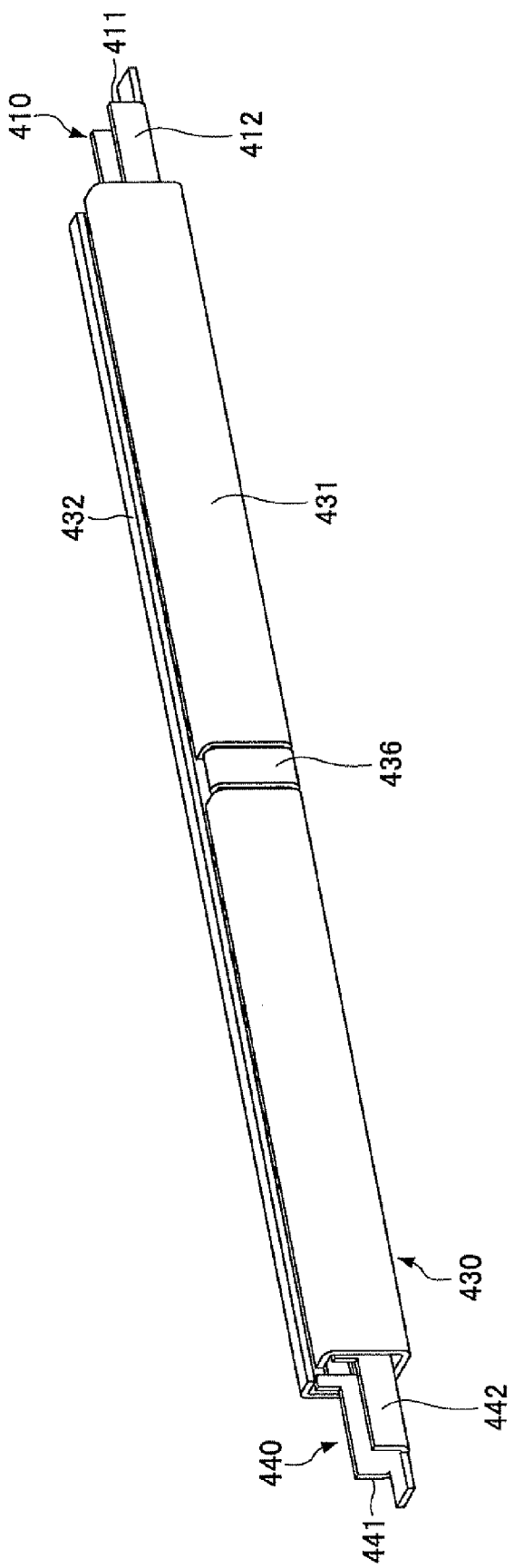
FIG. 14 is a perspective view of a probe of a fifth embodiment of the present disclosure.
Figure 15:
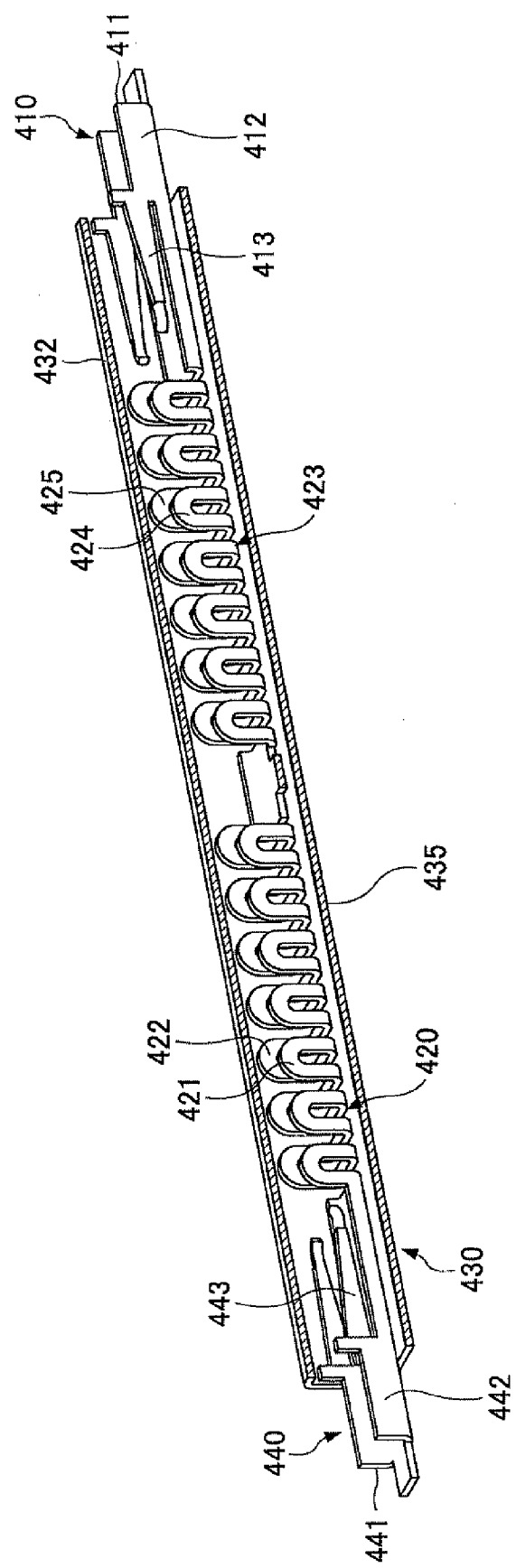
FIG. 15 is a perspective view of an internal structure of the probe of the fifth embodiment.

Specifically, as illustrated in FIG. 14 and FIG. 15, the probe of this embodiment is manufactured by press forming (punching and bending) one sheet of a sheet-metal plate which is made of copper or an alloy containing copper. Therefore, the probe of this embodiment has a unified configuration in which the components of the probe are continuously linked together.

The probe of this embodiment is constituted to include a first terminal portion 410 at one end of the probe, spring portions 420 and 423, a housing portion 430, and a second terminal portion 440 at the other end of the probe.

In this embodiment, the first terminal portion 410 is to be in contact with an electrode pad or an electrode terminal of an electric circuit or an electronic part fabricated on a wafer to establish electrical connection between the probe and the electric circuit or the electronic part. Specifically, a terminal portion 411 of the first terminal portion 410 is brought in contact with the electrode pad or the electrode terminal of the electric circuit or the electronic part, which is the object of inspection, to establish electrical connection between the probe and the electrode pad or the electrode terminal.

Side portions on both sides of the first terminal portion 410 are bent in an L-shaped formation along the longitudinal direction of the first terminal portion 410 to form terminal reinforcing portions 412. With the terminal reinforcing portions 412 (which are formed by bending the side portions of the first terminal portion 410 in an L-shaped formation), when the terminal portion 411 of the first terminal portion 410 is made to contact the electrode pad or the electrode terminal causing external force to be exerted on the first terminal portion 410, the terminal portion 411 of the first terminal portion 410 can be reliably made to contact the electrode pad or the electrode terminal without deforming the first terminal portion 410.

Each of the spring portions 420 and 423 has a configuration which is formed by bending a sheet-metal plate with U-shaped unit portions being arrayed in the longitudinal direction in a zigzag formation, along two longitudinal lines of the spring portion to have a rectangular cross-section. One side portion 421 and the other side portion 422 of the spring portion 420 which are formed as a result of the bending are substantially parallel to each other. One side portion 424 and the other side portion 425 of the spring portion 423 which are formed as a result of the bending are substantially parallel to each other.

In this embodiment, the spring portions 420 and 423 are formed to have a rectangular cross-section. Alternatively, the spring portions 420 and 423 may be formed to have a U-shaped cross-section.

Each of the spring portions 420 and 423 in this embodiment has the configuration in which the U-shaped unit portions are arrayed on the sides thereof in a zigzag formation, and each of the spring portions 420 and 423 has elasticity and functions as a spring that can be resiliently deformed.

The housing portion 430 is formed to surround the whole spring portions 420 and 423 by bending the portion of the sheet metal plate corresponding to the housing portion 430. Specifically, the portion of the sheet metal plate corresponding to the housing portion 430 is bent along two being lines to form a side portion 431 and an upper face portion 432. At this time, a lower face portion 435 is also formed simultaneously with the forming of the side portion 431, so that the whole spring portions 420 and 423 may be surrounded by the housing portion 430 having a generally rectangular cross-section.

The housing portion 430 and the spring portions 420 and 423 are bent by about 180 degrees at a center portion 436 corresponding to the boundary therebetween and accommodated in the housing portion 430 of the spring portions 420 and 423.

In this embodiment, the second terminal portion 440 is electrically connected to the measuring instrument, such as a prober, and an electrode signal obtained when the first terminal portion 410 is brought in contact with the electrode pad or the electrode terminal is transmitted to the measuring instrument via the second terminal portion 440. Specifically, a terminal portion 441 of the second terminal portion 440 is in contact with an electrode terminal provided for connecting with the measuring instrument, such as a prober, so that the second terminal portion 440 is electrically connected to the measuring instrument.

The side portions of the second terminal portion 440 are bent in an L-shaped formation along the longitudinal direction of the second terminal portion 440 to form terminal reinforcing portions 442. With the terminal reinforcing portions 442 (which are formed by bending the side portions of the second terminal portion 440 in an L-shaped formation), when the terminal portion 441 of the second terminal portion 440 is made to contact the electrode pad or the electrode terminal causing external force to be exerted on the terminal portion 441, the terminal portion 441 of the second terminal portion 440 can be reliably made to contact the electrode terminal without deforming the second terminal portion 440.

In this embodiment, the terminal reinforcing portions 412 and 442 are formed to have a rectangular cross-section by bending the side portions of the first terminal portion 410 and the second terminal portion 440 in an L-shaped formation. Alternatively, the terminal reinforcing portions 412 and 442 may be formed to have a V-shaped cross-section by bending the central area thereof or may be formed to have a U-shaped or semicircular cross-section by forming a curved surface thereon.

In this embodiment, the housing connecting portion 413 is provided in the vicinity of the first terminal portion 410, and this housing connecting portion 413 is in contact with the internal wall of the side portion 431 of the housing portion 430, and the housing connecting portion 413 and the housing portion 430 are electrically connected to each other. The housing connecting portion 443 is provided in the vicinity of the second terminal portion 440, and this housing connecting portion 443 is in contact with the internal wall of the side portion 431 of the housing portion 430, and the housing connecting portion 443 and the housing portion 430 are electrically connected to each other.

Thus, the housing connecting portion 413 and the housing portion 430 are electrically connected to each other, and the housing connecting portion 443 and the housing portion 430 are electrically connected to each other. An electrical signal from the terminal portion 411 of the first terminal portion 410 is transmitted to the terminal portion 441 of the second terminal portion 440 via the housing connecting portion 413, the housing portion 430, and the housing connecting portion 443. Because the housing portion 430 has a large cross-sectional area in the portion through which the electrical signal flows, the electric resistance from the first terminal portion 410 to the second terminal portion 440 can be lowered. Therefore, the electrical signal from the first terminal portion 410 can be transmitted to the second terminal portion 440 with a low resistance.

The probe of this embodiment includes the spring portion 420 connected to the first terminal portion 410 and the spring portion 423 connected to the second terminal portion 440, and both the first terminal portion 410 and the second terminal portion 440 can be resiliently deformed. In the probe of this embodiment, the spring portions 420 and 423 are physically, connected and fixed to the housing portion 430 at the center portion 436. Therefore, the terminal portion of the first terminal portion 410 can be reliably made to contact the electrode pad or the electrode terminal, and the terminal portion of the second terminal portion 440 can be reliably made to contact the electrode pad or the electrode terminal.

Figure 16:
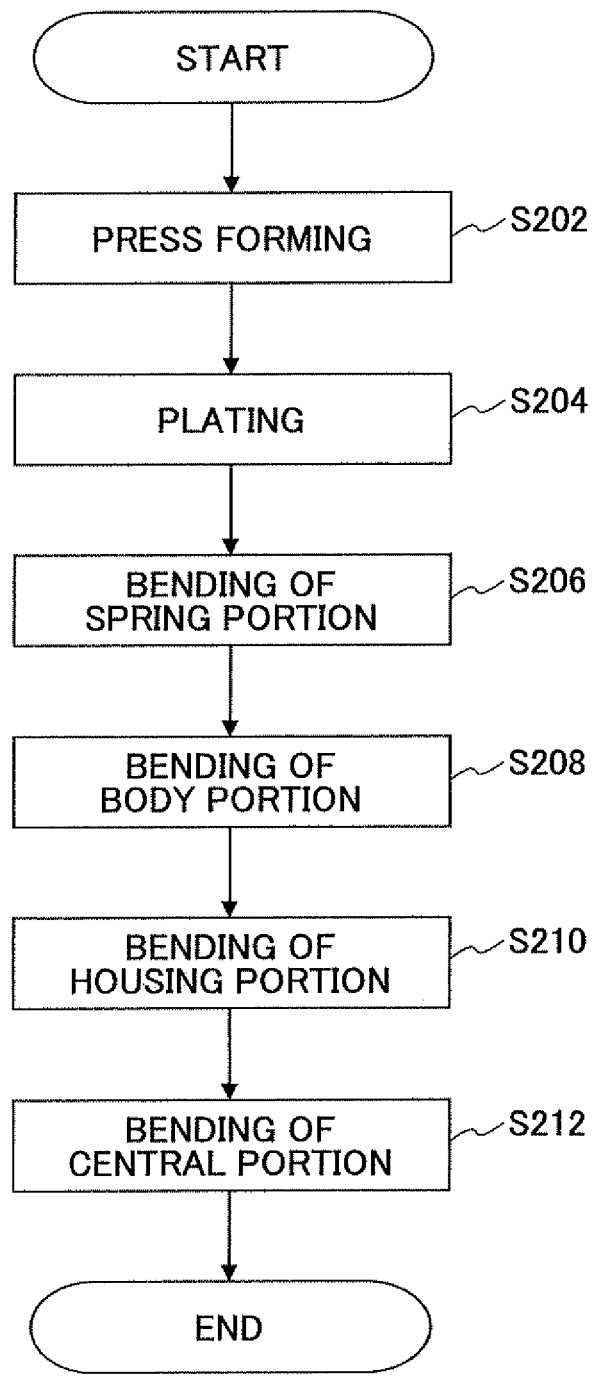
FIG. 16 is a flowchart for explaining a method of manufacturing the probe of the fifth embodiment.

Next, a method of manufacturing the probe of this embodiment will be described with reference to FIG. 16.

Upon start of the method of manufacturing the probe of this embodiment, in step S202, a sheet metal plate having a predetermined configuration is formed (metal plate forming step). The sheet metal plate having the predetermined configuration may be formed by either press forming or etching.

The sheet metal plate is made of copper or an alloy containing copper, and a thickness of the sheet metal plate is in a range of 30 micrometers-150 micrometers. In this embodiment, the sheet metal plate having the predetermined configuration is formed by press forming a blank sheet metal plate of copper having a thickness of 60 micrometers.

Figure 17:
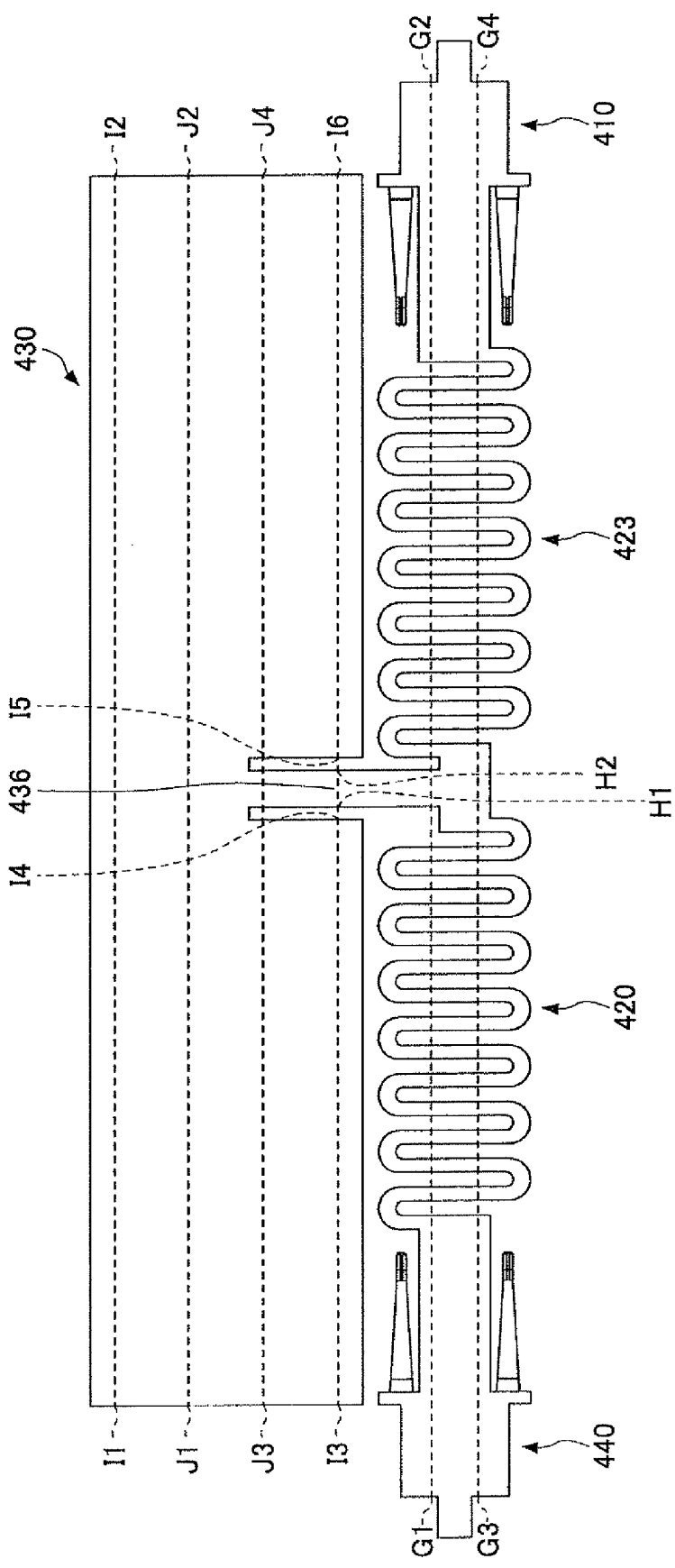
FIG. 17 is a diagram for explaining the method of manufacturing the probe of the fifth embodiment.

FIG. 17 illustrates an example of the sheet metal plate which is formed to have the predetermined configuration. The sheet metal plate of FIG. 17 includes a main body portion which is provided to form the probe of this embodiment. This main body portion includes the first terminal portion 410, the spring portions 420 and 423, the housing portion 430, and the second terminal portion 440 which are formed in the non-bent condition prior to the subsequent bending steps.

In the following, the first terminal portion 410, the spring portions 420 and 423, the housing portion 430, and the second terminal portion 440 which are in the non-bent condition will be referred to as the portion of the sheet metal plate corresponding to the first terminal portion 410, the portions of the sheet metal plate corresponding to the spring portions 420 and 423, the portion of the sheet metal plate corresponding to the housing portion 430, and the portion of the sheet metal plate corresponding to the second terminal portion 440, respectively. The main body portion of the sheet metal plate of FIG. 17 is constituted to include the portion of the sheet metal plate corresponding to the first terminal portion 410, the portions of the sheet metal plate corresponding to the spring portions 423 and 420, and the portion of the sheet metal plate corresponding to the second terminal portion 440, which are arrayed in this order from one end (on the right-hand side of FIG. 17) of the main body portion. The portion of the sheet metal plate corresponding to the housing portion 430 is formed along the portions of the sheet metal plate corresponding to the spring portions 420 and 423 and extends in the longitudinal direction of the main body portion. The portion of the sheet metal plate corresponding to the housing portion 430 is connected to the center portion 436 corresponding to the boundary between the portions of the sheet metal plate corresponding to the spring portions 420 and 423. The probe of this embodiment is produced by bending the main body portion multiple times.

Subsequently, in step S204, the main body portion is plated (plating step). This plating step is performed by sequentially performing plating of Ni (nickel), plating of Pd (palladium), and plating of Au (gold) in this order. Alternatively, the plating step may be done by sequentially performing plating of Ni and plating of Au in this order.

Subsequently, in step S206, the portions of the sheet metal plate corresponding to the spring portions 420 and 423 are bent (first bending step). Specifically, the portions of the sheet metal plate corresponding to the spring portions 420 and 423 are bent by 90 degrees along the dotted line G1-G2 illustrated in FIG. 17, and further bent by 90 degrees along the dotted line G3-G4 in the same direction. Thereby, the portions of the sheet metal plate corresponding to the spring portions 420 and 423 are bent to have a rectangular cross-section.

By bending the portions of the sheet metal plate corresponding to the spring portions 420 and 423 to have a rectangular cross-section, the surface formed by one side portion 421 of the spring portion 420 and the surface formed by the other side portion 422 of the spring portion 420 are substantially parallel to each other, and the surface formed by one side portion 424 of the spring portion 423 and the surface formed by the other side portion 425 of the spring portion 423 are substantially parallel to each other.

At this time, the side portions of the first terminal portion 410 are simultaneously bent by 90 degrees to form the head-end reinforcing portions 412, and the portion of the sheet metal plate corresponding to the housing connecting portion 413 is formed to have a configuration conforming to that of one side portion 424 and the other side portion 425 of the spring portion 423. Similarly, the side portions of the second terminal portion 440 are bent by 90 degrees to form the head-end reinforcing portions 442, and the portion of the sheet metal plate corresponding to the housing connecting portion 443 is formed to have a configuration conforming to that of one side portion 421 and the other side portion 422 of the spring portion 420.

Subsequently, in step S208, the main body portion is bent (second bending step). Specifically the main body portion is bent by 180 degrees along the dotted line H1-H2 in the center portion 436 illustrated in FIG. 17, to the side in which the spring portions 420 and 423 are bent. Thereby, the housing portion 430 is arranged on the back side of the spring portions 420 and 423. In the step S208, the side portions of the portion of the sheet metal plate corresponding to the housing portion 430 are bent by 90 degrees along the dotted line I1-I2 and the dotted line I3-I4 in the direction in which the spring portions 420 and 423 are bent. The portion of the sheet metal plate corresponding to the upper face portion 432 is formed, and further the housing connecting portions 413 and 443 are slightly bent outside so that the housing connecting portions 413 and 443 and the internal walls of the housing portion 430 are in contact with each other.

Figure 18:
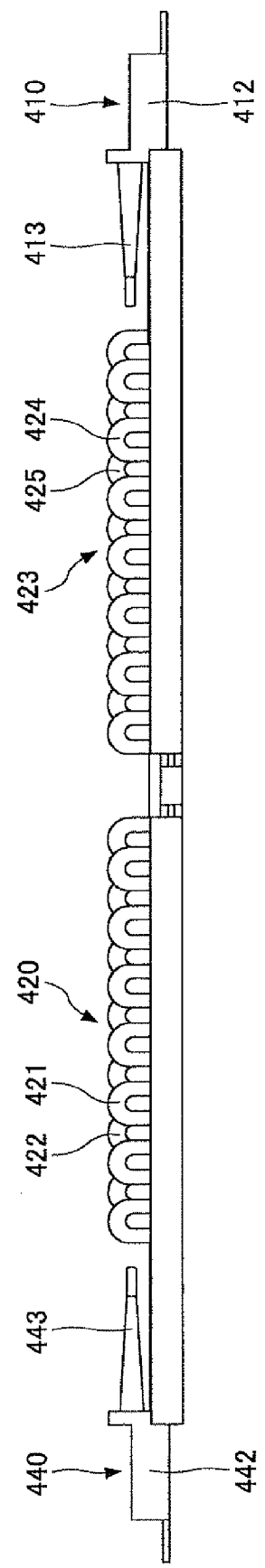
FIG. 18 is a side view of the probe in the middle of the method of manufacturing the probe of the fifth embodiment.
Figure 19:
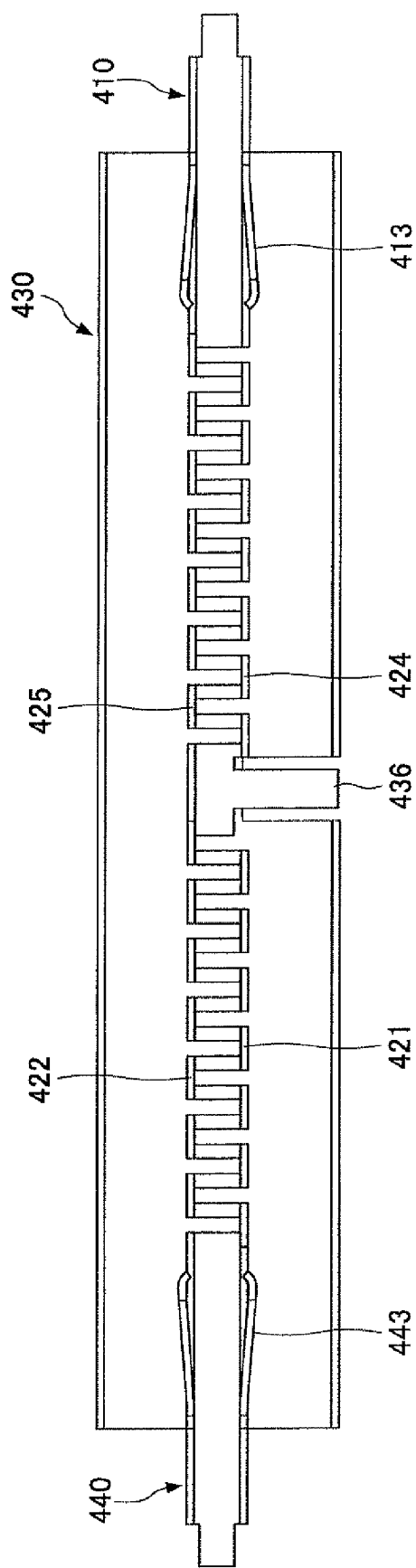
FIG. 19 is a top view of the probe in the middle of the method of manufacturing the probe of the fifth embodiment.
Figure 20:
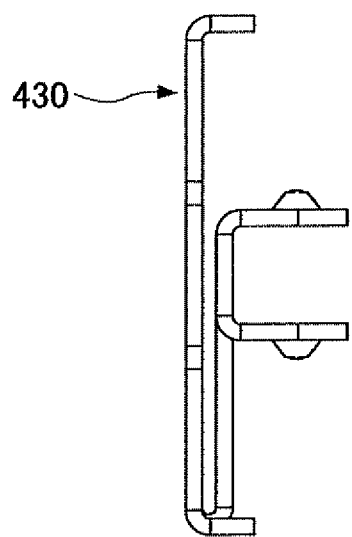
FIG. 20 is a front view of the probe in the middle of the method of manufacturing the probe of the fifth embodiment.
Figure 21:
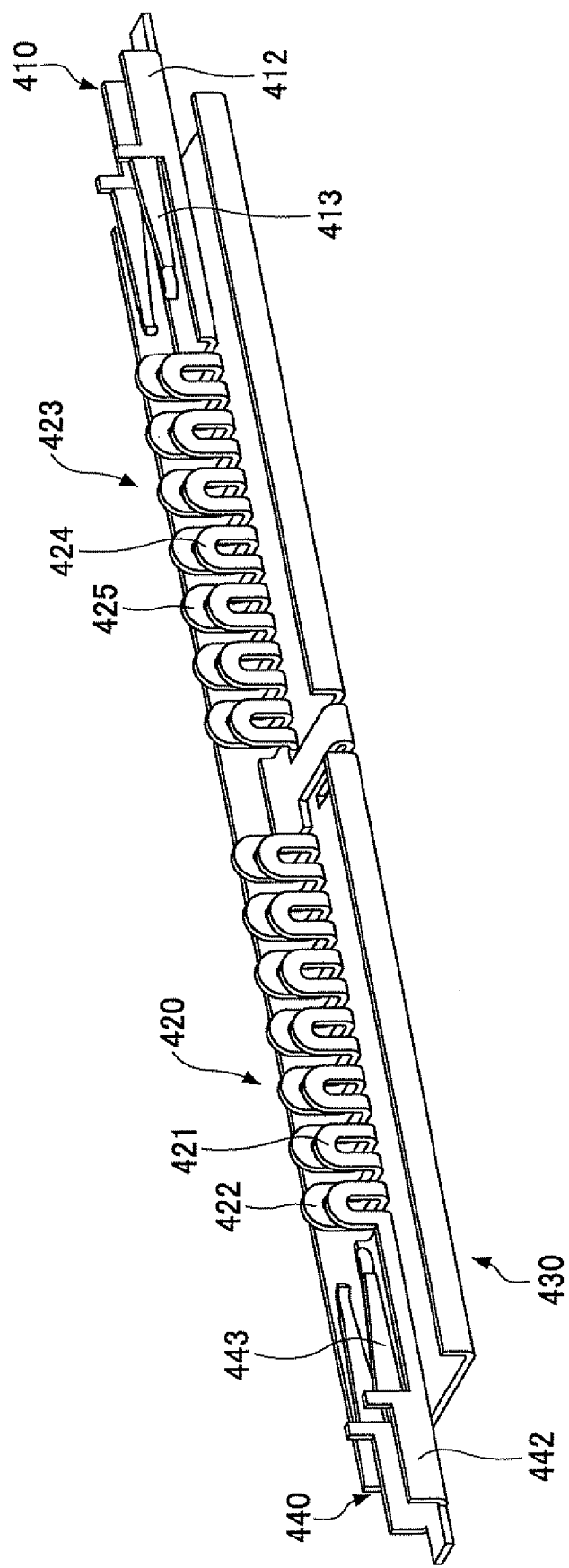
FIG. 21 is a perspective view of the probe in the middle of the method of manufacturing the probe of the fifth embodiment.
Figure 22:
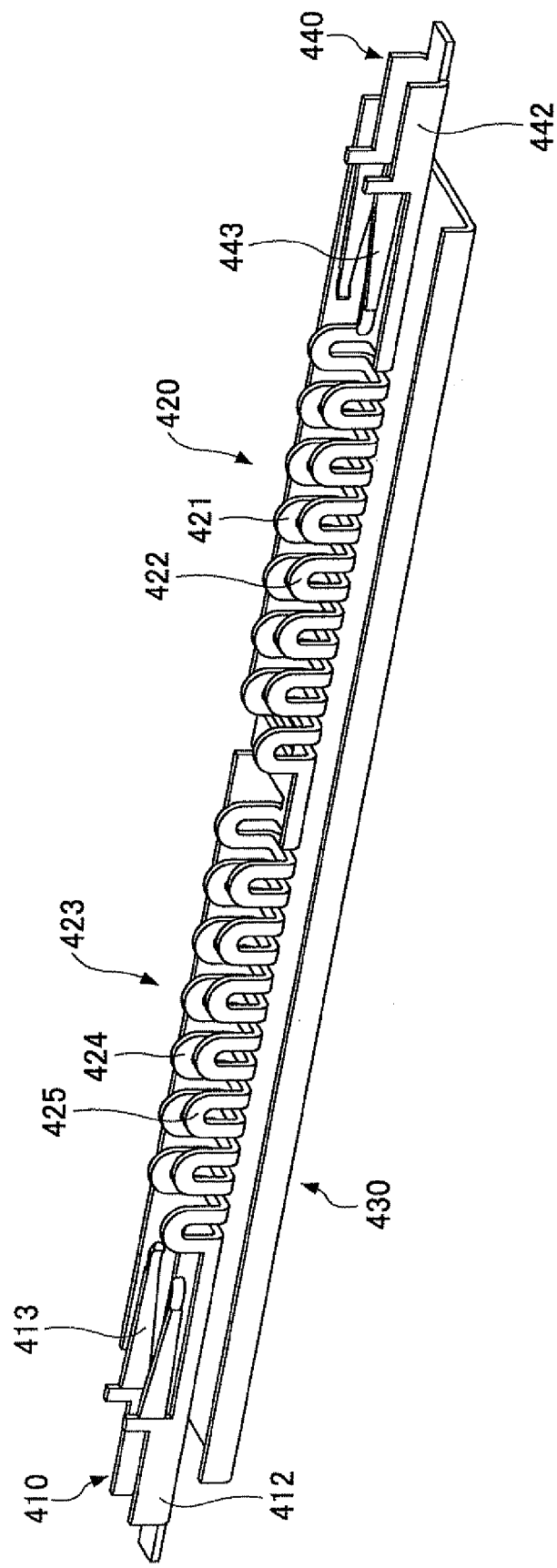
FIG. 22 is a perspective view of the probe in the middle of the method of manufacturing the probe of the fifth embodiment.

FIGS. 18-22 illustrate the appearance of the main body portion which is in the bent condition in step S208. FIG. 18 is a side view of the main body portion, FIG. 19 is a top view of the main body portion, FIG. 20 is a front view of the main body portion, and FIG. 21 and FIG. 22 are perspective views of the main body portion.

Subsequently, in step S210, the portion of the sheet metal plate corresponding to the housing portion 430 is bent (third bending step). Specifically, the portion of the sheet metal plate corresponding to the housing portion 430 is bent by 90 degrees along the dotted line J1-J2 illustrated in FIG. 17 in the direction that is the same as the direction in which the spring portions 420 and 423 are bent, and further bent by 90 degrees along the dotted line J3-J4 to form the side portions 431 of the housing portion 430.

At this time, the lower face portion 435 is also formed simultaneously with the forming of the side portions 431, and the whole spring portion 420 is surrounded by the housing portion 430. Moreover, the housing connecting portion 413 and the internal wall of the side portion 431 of the housing portion 430 are in contact and electrically connected with each other, and the housing connecting portion 443 and the internal wall of the side portion 431 of the housing portion 430 are in contact and electrically connected with each other.

Figure 23:
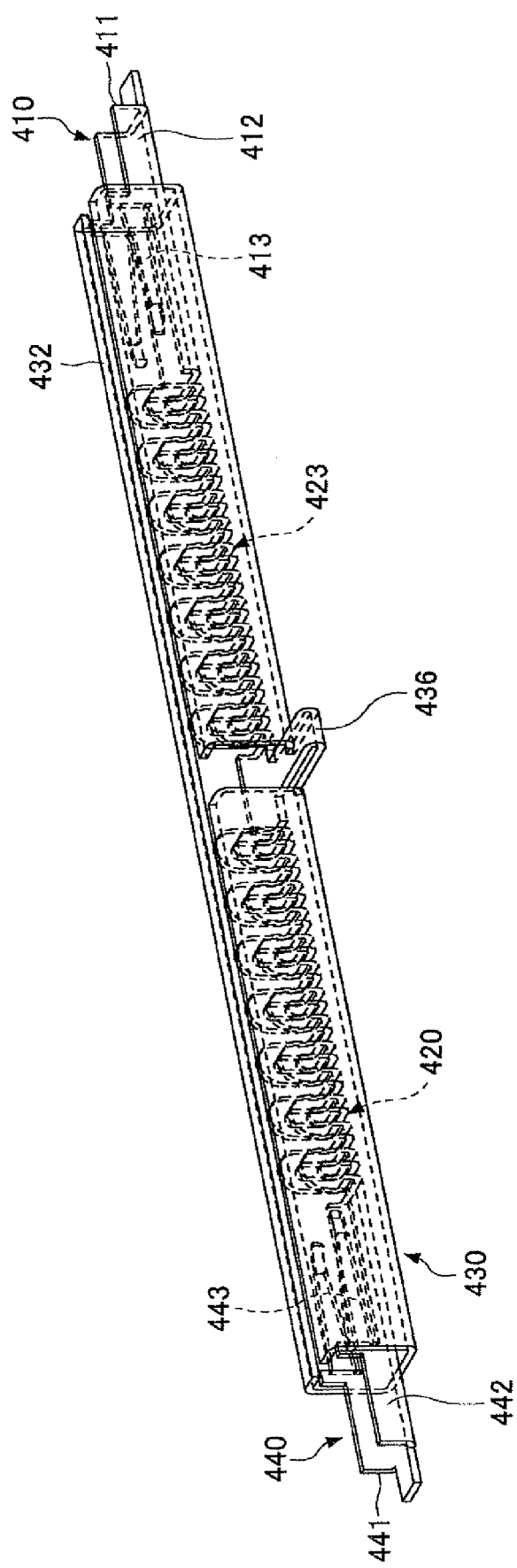
FIG. 23 is a perspective view of the probe in step S210 of the probe manufacturing method of the fifth embodiment.
Figure 24:
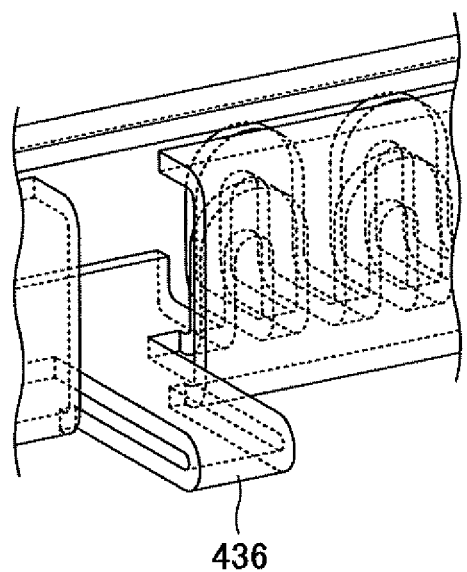
FIG. 24 is an enlarged view of the principal part of the probe in FIG. 23.

FIG. 23 is a perspective view of the probe in which the main body portion is bent in step S210 of the probe manufacturing method of this embodiment. FIG. 24 is an enlarged view of the principal part of the probe in the vicinity of the center portion 436 illustrated in FIG. 23.

Subsequently, in step S212, the center portion 436 is bent (bending of center portion). Specifically, the center portion 436 illustrated in FIG. 23 and FIG. 24 is bent to be in conformity with the side face of the housing portion 430. Thereby, the probe of this embodiment illustrated in FIG. 15 in which the housing portion 430 and the spring portions 420 and 423 are connected via the center portion 436 can be manufactured.

In the probe of this embodiment, the housing portion 430 and the first terminal portion 410 are in contact with each other in the housing connecting portion 413, and the housing portion 430 and the second terminal portion 440 are in contact with each other in the housing connecting portion 413.

Figure 25:
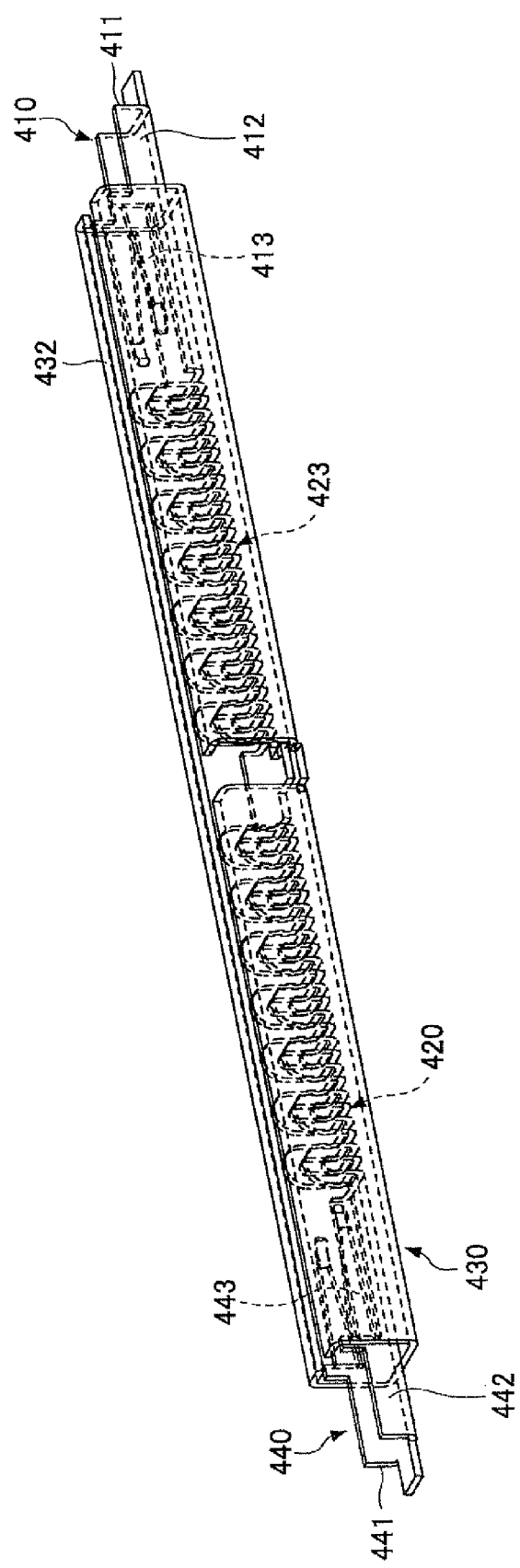
FIG. 25 is a perspective view of another probe of the fifth embodiment.

Alternatively, the step S212 of the probe manufacturing method of this embodiment may be arranged so that the center portion 436 illustrated in FIG. 23 and FIG. 24 is cut off as illustrated in FIG. 25. In the probe of such alternative embodiment, the housing portion 430 and the spring portions 420 and 423 are physically separated, but the housing portion 430 and the spring portion 420 are connected together in the housing connecting portion 413 and the housing portion 430 and the spring portion 423 are connected together in the housing connecting portion 443.

As described above, the probe of this embodiment can be manufactured by press forming one sheet of a sheet-metal plate. It is not necessary to assemble two or more components in an assembly process in order to manufacture the probe having a spring function. The probe manufacturing method includes only the press forming of a sheet-metal plate, the plating thereof, the bending thereof, and the cutting thereof if needed. Hence, the probe can be manufactured using a simple manufacturing device, and the probe manufacturing method itself is simple. It is possible to manufacture a large number of probes speedily with low cost. Therefore, the probe having a spring function can be speedily manufactured with low cost.

Next, a probe of a sixth embodiment of the present disclosure will be described. The probe of this embodiment is used for inspecting an electronic part, an electric circuit, etc., and the probe is made to contact an electrode pad or an electrode terminal of the electronic part, the electric circuit, etc., to establish electrical connection.

Figure 26:
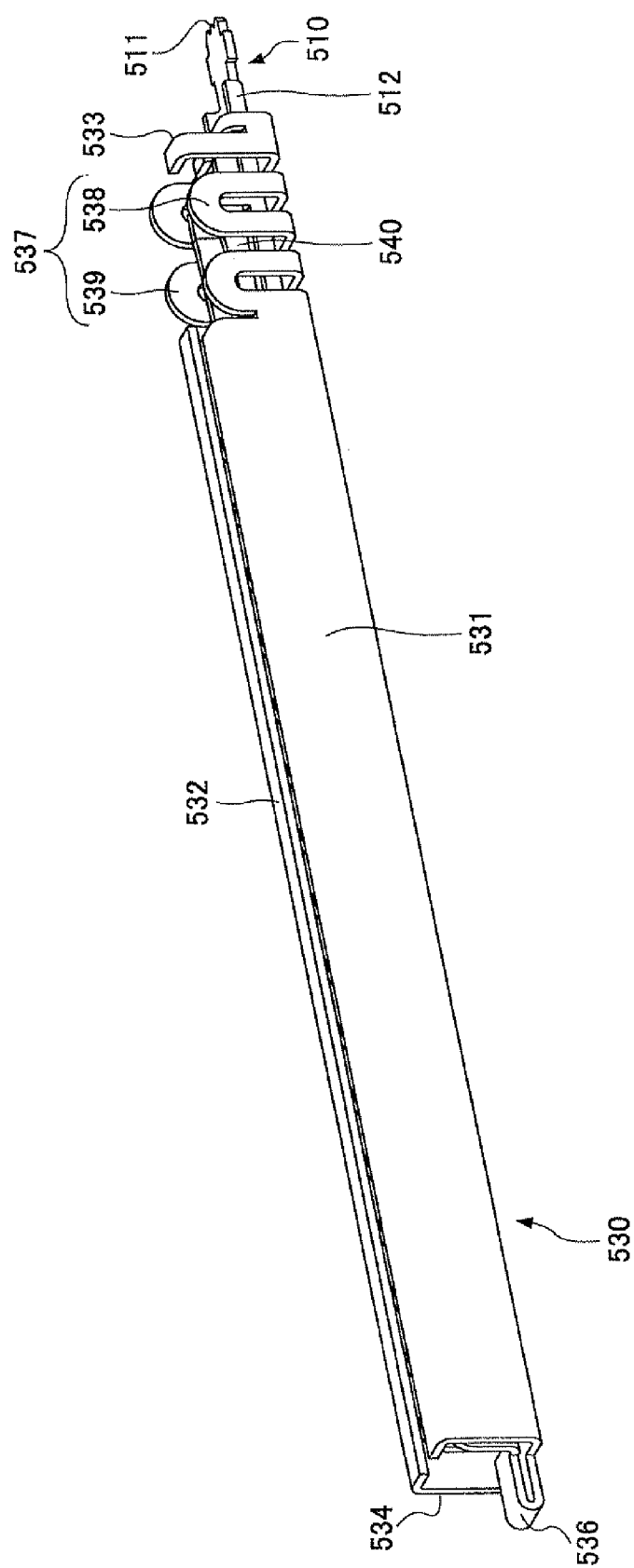
FIG. 26 is a perspective view of a probe of a sixth embodiment of the present disclosure.
Figure 27:
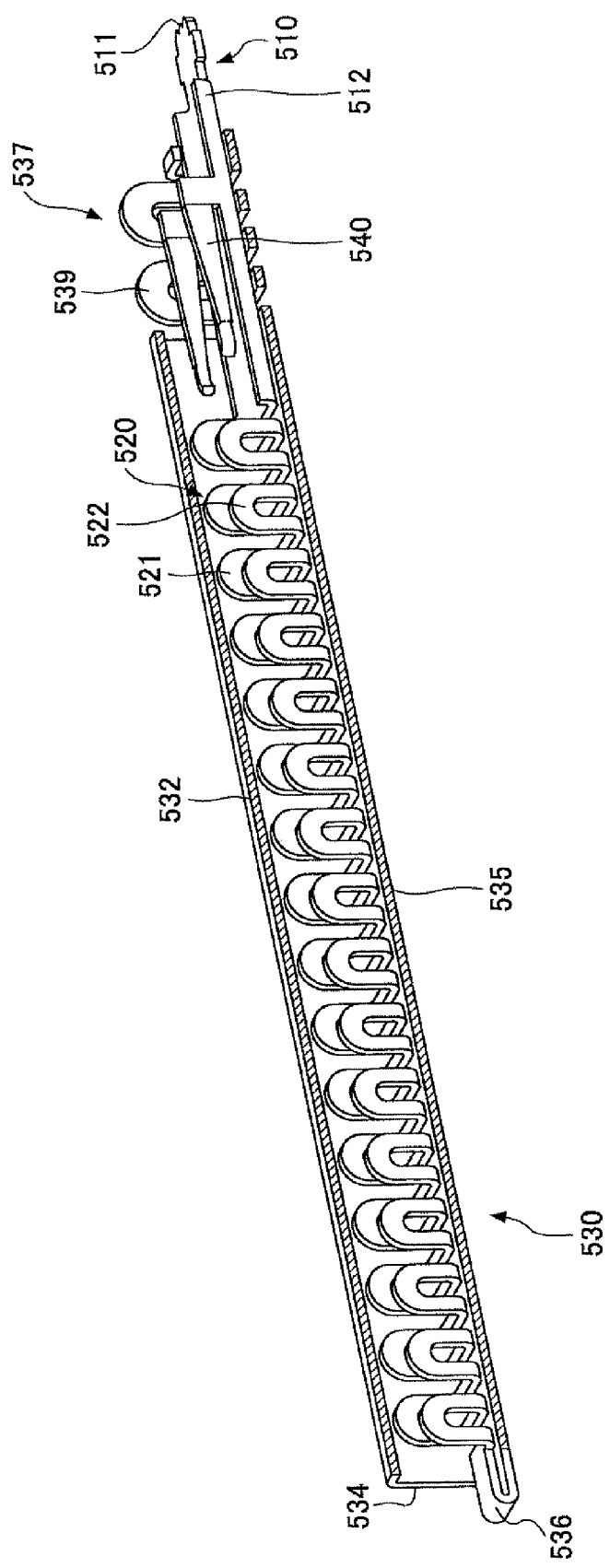
FIG. 27 is a perspective view of an internal structure of the probe of the sixth embodiment.

Specifically, as illustrated in FIG. 26 and FIG. 27, the probe of this embodiment is formed by press forming (punching and bending) one sheet of a sheet-metal plate which is made of copper or an alloy containing copper. Therefore, the probe of this embodiment has a unified configuration in which the components of the probe are continuously linked together.

The probe of this embodiment is constituted to include a terminal portion 510, a spring portion 520, a housing portion 530, and a housing connecting portion 540.

In this embodiment, the terminal portion 510 is to be in contact with an electrode pad or an electrode terminal of an electric circuit or an electronic part fabricated on a wafer to establish electrical connection. One end of the terminal portion 510 is arranged to form a terminal contact portion 511. This terminal contact portion 511 is brought in contact with the electrode pad or the electrode terminal of the electric circuit or the electronic part, which is the object of inspection, to establish electrical connection.

Side portions of the terminal portion 510 are bent in an L-shaped formation along the longitudinal direction of the terminal portion 510 to form head-end reinforcing portions 512. With the head-end reinforcing portions 512 (which are formed by bending the side portions of the terminal portion 510 in an L-shaped formation), when the terminal portion 510 is made to contact the electrode pad or the electrode terminal causing external force to be exerted on the terminal portion 510, the terminal contact portion 511 can be reliably made to contact the electrode pad or the electrode terminal without deforming the terminal portion 510.

In this embodiment, the head-end reinforcing portions 512 are formed to have a rectangular cross-section by bending the side portions of the terminal portion 510 in an L-shaped formation. Alternatively, the head-end reinforcing portions 512 may be formed to have a V-shaped cross-section by bending the central area thereof or may be formed to have a U-shaped or semicircular cross-section by forming a curved surface thereon.

The spring portion 520 has a configuration which is formed by bending a sheet-metal plate with U-shaped unit portions being arrayed in the longitudinal direction in a zigzag formation, along two longitudinal lines of the spring portion 520 to have a rectangular cross-section, and one side portion 521 and the other side portion 522 of the spring portion 520 which are formed as a result of the bending are substantially parallel to each other.

In this embodiment, the spring portion 520 is formed to have a rectangular cross-section. Alternatively, the spring portion 520 may be formed to have a U-shaped cross-section.

The spring portion 520 in this embodiment has the configuration in which the U-shaped unit portions are arrayed on the sides thereof in a zigzag formation, and the spring portion 520 has elasticity and functions as a spring that can be resiliently deformed.

The housing portion 530 is formed to surround the whole spring portion 520 by bending the portion of the sheet metal plate corresponding to the housing portion 530. Specifically, the portion of the sheet metal plate corresponding to the housing portion 530 is bent along two bending lines to form a side portion 531 and an upper face portion 532. The housing portion 530 includes a housing spring portion 537 in the vicinity of the terminal portion 510, and the housing spring portion 537 has a configuration in which U-shaped unit portions are arrayed on the sides thereof in a zigzag formation.

The housing spring portion 537 has the configuration which is formed by bending the sheet metal plate along bending lines on the extension of the bending lines of the housing portion 530, simultaneously with the forming of the side portion 531 and the upper face portion 532 of the housing portion 530, to have a rectangular cross-section, and one side portion 538 and the other side portion 539 of the housing spring portion 537 which are formed as a result of the bending are substantially parallel to each other. The housing spring portion 537 has the configuration in which the U-shaped unit portions are arrayed on the sides thereof in a zigzag formation, and the housing spring portion 537 has elasticity and functions as a spring that can be resiliently deformed.

The upper face portion 532 is formed by bending the side portion of the portion of the sheet metal plate corresponding to the housing portion 530, and the lower face portion 535 is also formed by bending the side portion 531, so that the whole spring portion 520 can be surrounded by the housing portion 530 having a generally rectangular cross-section.

A housing front portion 533 is formed by one end of the housing portion 530 in the vicinity of the terminal portion 510, and a housing rear portion 534 is formed by the other end of the housing portion 530 in the vicinity of the curved portion 536. The housing portion 530 and the spring portions 520 are bent by about 180 degrees at the curved portion 536 corresponding to the boundary therebetween and accommodated in the housing portion 530 of the spring portion 520. The curved portion 536 is electrically connected to the measuring instrument, such as a prober, and an electrode signal obtained when the terminal contact portion 511 is made to contact the electrode pad or the electrode terminal is transmitted to the measuring instrument via the curved portion 536.

The housing terminal portion 540 is in contact with the internal wall of the side portion 531 of the housing portion 530, and the housing connecting portion 540 and the housing portion 530 are electrically connected with each other. Specifically, the housing connecting portion 540 and the housing portion 530 are electrically connected with each other, and an electrical signal from the terminal contact portion 511 is transmitted to the curved portion 536 via the terminal portion 510, the housing connecting portion 540, and the housing portion 530. Because the housing portion 530 has a large cross-sectional area in the portion through which the electrical signal flows, the electric resistance from the terminal contact portion 511 to the curved portion 536 can be lowered. Therefore, the electrical signal from the terminal contact portion 511 can be transmitted to the curved portion 536 with a low resistance. In the probe of this embodiment, the housing portion 530 and the housing connecting portion 540 are electrically connected with each other at one place only, and it is possible to reduce the contact resistance.

Next, the manner of use of the probe of this embodiment will be described.

Figure 28:
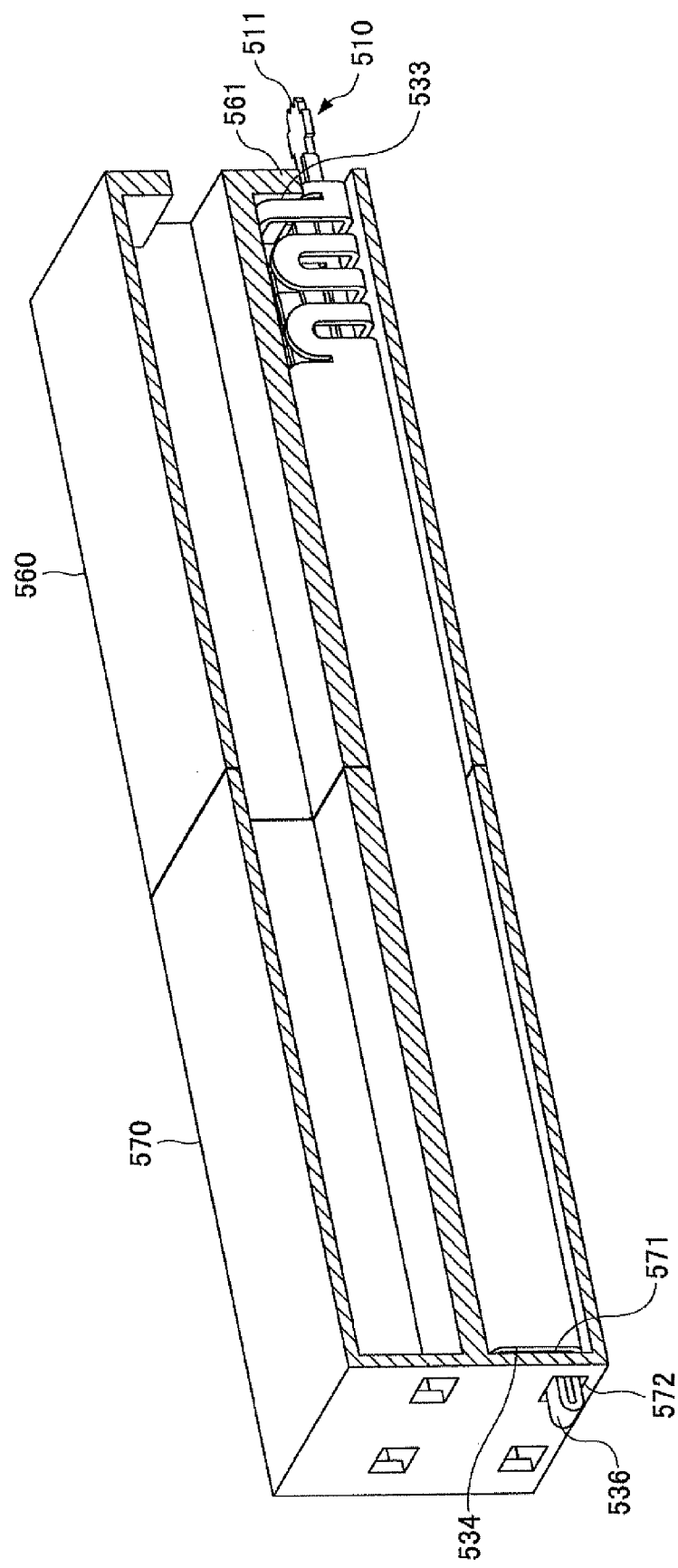
FIG. 28 is a perspective view of a condition of use of the probe of the sixth embodiment.

Plural probes of this embodiment are arranged in insulation frames 560 and 570 in a two-dimensional formation at substantially equal intervals. Specifically, in the probe of this embodiment, as illustrated in FIGS. 26 and 27, there are provided two spring portions including the spring portion 520 connected to the terminal portion 510, and the housing spring portion 537 connected to the housing portion 530. Therefore, as illustrated in FIG. 28, when the plural probes of this embodiment are arranged in the insulation frames 560 and 570 in a two-dimensional formation, the housing front portion 533 of each probe of this embodiment and the holding portion 561 of the insulation frame 560 are in contact with each other, and the housing rear portion 534 of each probe of this embodiment and the holding portion 571 of the insulation frame 570 are in contact with each other. The insulation frame 560 and the insulation frame 570 are secured to each other, and external force is exerted on each probe of this embodiment through the holding portion 561 and the holding portion 571 in the direction in which the housing front portion 533 and the housing rear portion 534 are compressed (i.e., in the direction in which the housing portion 530 of the probe is contracted). Because the housing spring portion 537 has the spring function, the probe of this embodiment is fixed to the insulation frames 560 and 570 by this compressive force. In this condition, the spring portion 520 does not contribute to the fixing of the probe. Therefore, when the terminal contact portion 511 of the terminal portion 510 of the probe is made to contact an electrode pad or an electrode terminal, electrical connection can be established with the spring function of the spring portion 520. The curved portion 536 projects to the outside from an opening 572 of the insulation frame 570, and electrical connection between the curved portion 536 and an electrode terminal of the measuring instrument is possible.

In the probe of this embodiment, when a substrate is fixed to the curved portion 536, contact force to the substrate can be generated with the spring function of the housing spring portion 537. Regardless of the contact force generated by the curved portion 536 due to a displacement of the terminal contact portion 511, the contact force to the substrate can be generated by the housing spring portion 537.

In this embodiment, the probe is arranged so that the housing spring portion 537 is disposed in the vicinity of the housing front portion 533 where the terminal portion 510 is provided. Alternatively, the probe may be arranged so that the housing spring portion 537 is disposed in the vicinity of the housing rear portion 534 where the curved portion 536 is provided, as illustrated in FIG. 29 and FIG. 30.

Figure 29:
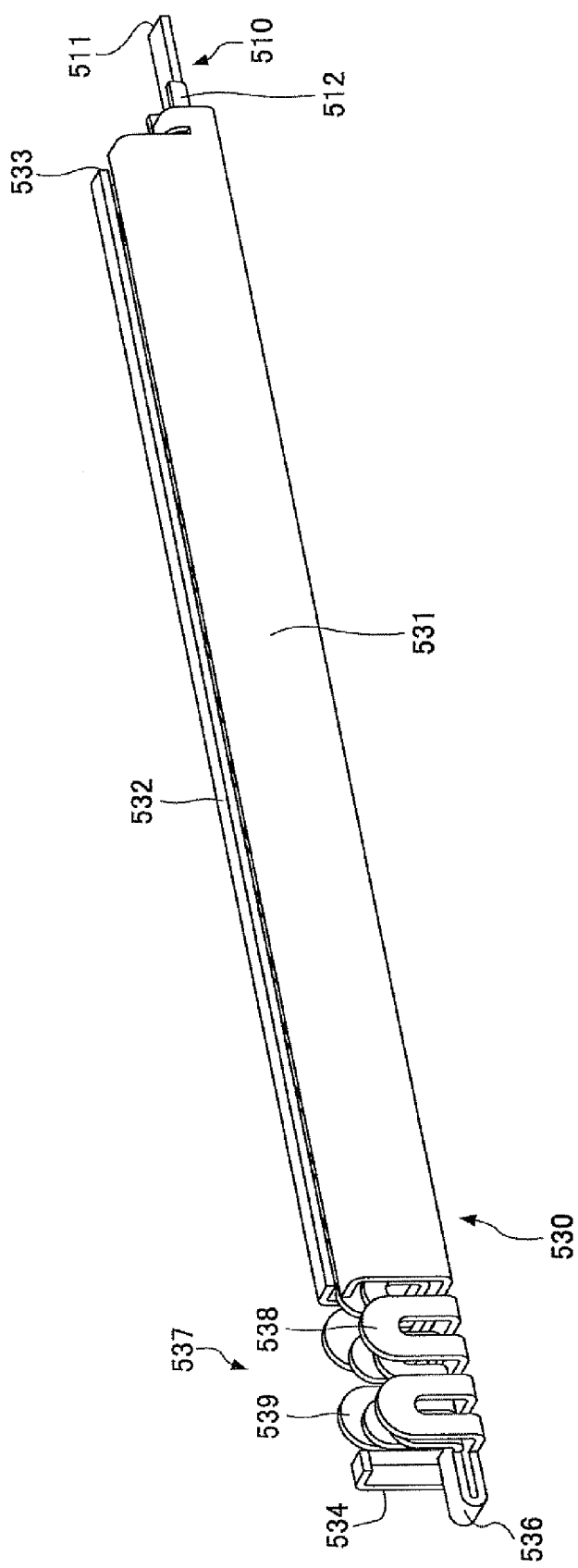
FIG. 29 is a perspective view of another probe of the sixth embodiment.
Figure 30:
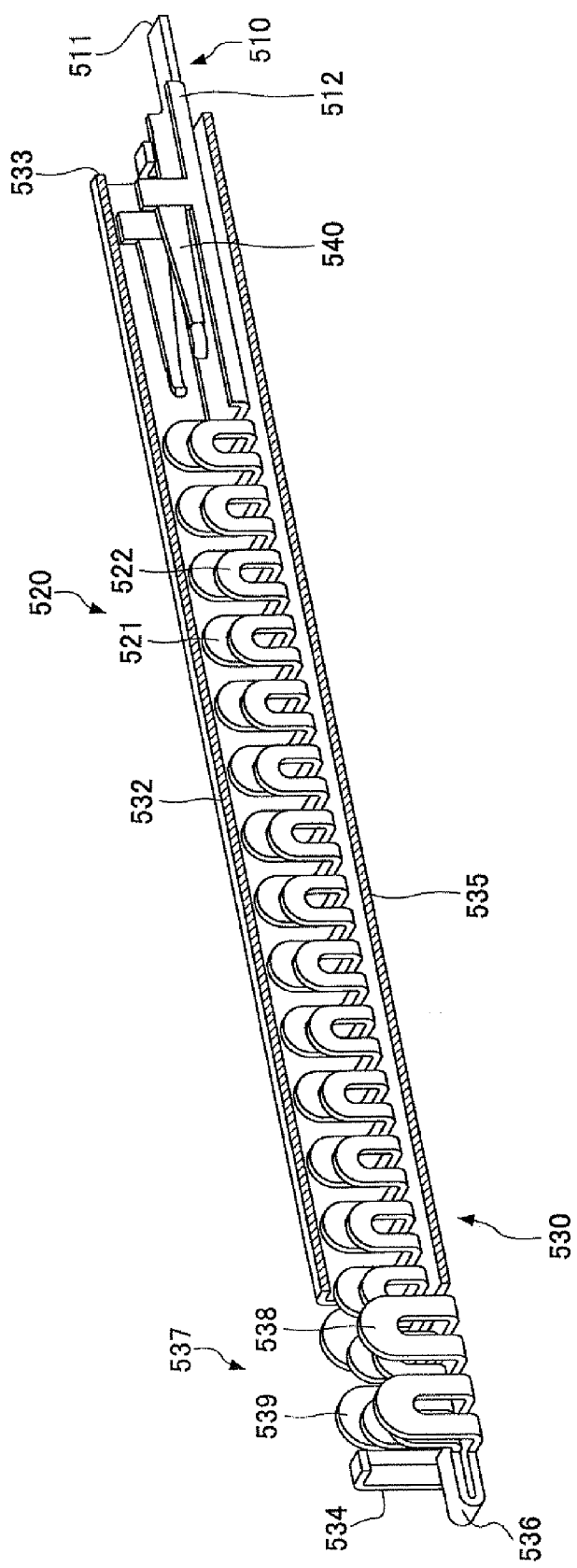
FIG. 30 is a perspective view of an internal structure of another probe of the sixth embodiment.

In FIG. 29 and FIG. 30, the elements which are the same as corresponding elements in FIG. 26 and FIG. 27 are designated by the same reference numerals, and a description thereof will be omitted.

Figure 31:
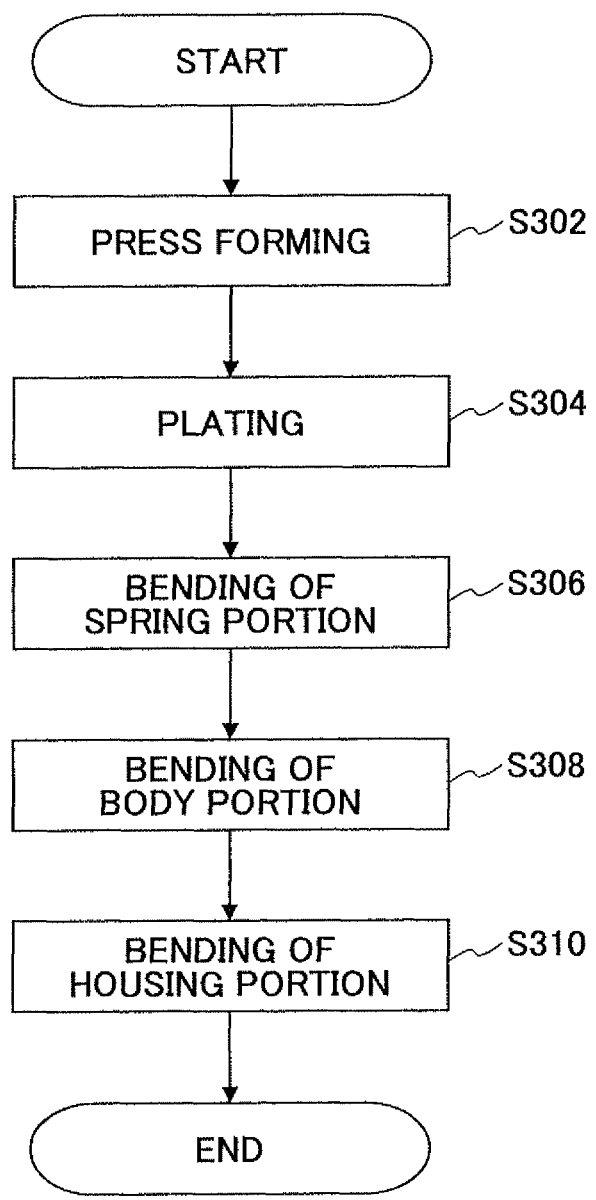
FIG. 31 is a flowchart for explaining a method of manufacturing the probe of the sixth embodiment.

Next, a method of manufacturing the probe of this embodiment will be described with reference to FIG. 31.

Upon start of the method of manufacturing the probe of this embodiment, in step S302, a sheet metal plate having a predetermined configuration is formed (metal plate forming step). The sheet metal plate having the predetermined configuration may be formed by either press forming or etching. The sheet metal plate is made of copper or an alloy containing copper, and a thickness of the sheet metal plate is in a range of 30 micrometers-150 micrometers. In this embodiment, the sheet metal plate having the predetermined configuration is formed by press forming a blank sheet metal plate of copper having a thickness of 60 micrometers.

Figure 32:
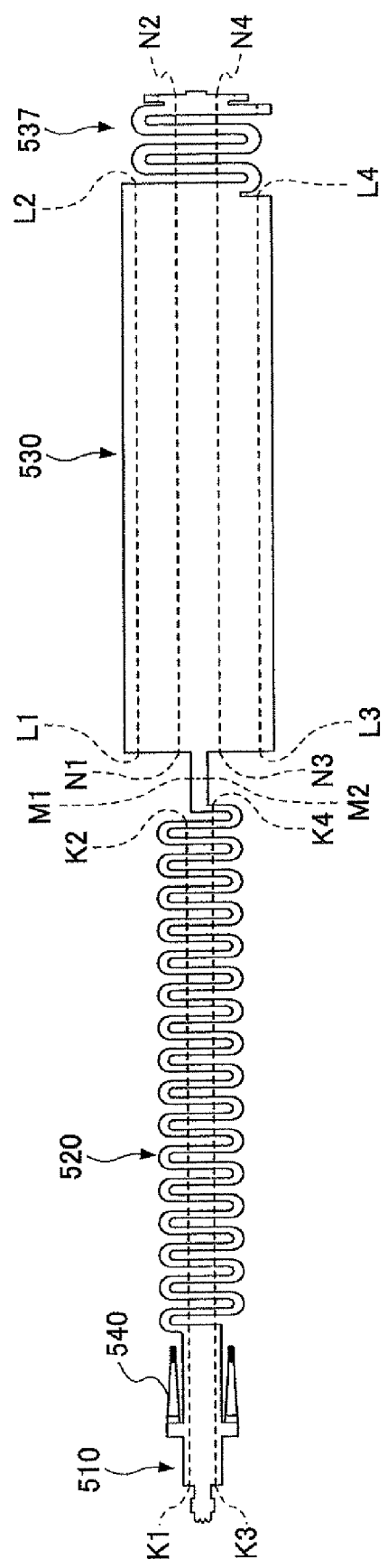
FIG. 32 is a diagram for explaining the method of manufacturing the probe of the sixth embodiment.

FIG. 32 illustrates an example of the sheet metal plate which is formed to have the predetermined configuration. The sheet metal plate of FIG. 32 includes a main body portion only. The main body portion includes the terminal portion 510, the spring portion 520, the housing portion 530, and the housing connecting portion 540, which are formed in the non-bent condition prior to the subsequent bending steps.

In the following, the terminal portion 510, the spring portion 520, the housing portion 530, and the housing connecting portion 540 which are in the non-bent condition will be referred to as the portion of the sheet metal plate corresponding to the terminal portion 510, the portion of the sheet metal plate corresponding to the spring portion 520, the portion of the sheet metal plate corresponding to the housing portion 530, and the portion of the sheet metal plate corresponding to the housing connecting portion 540, respectively.

The main body portion in the punched condition as a result of the press forming is illustrated in FIG. 32. The main body portion is constituted to include the portion of the sheet metal plate corresponding to the terminal portion 510, the portion of the sheet metal plate corresponding to the housing connecting portion 540, the portion of the sheet metal plate corresponding to the spring portion 520, and the portion of the sheet metal plate corresponding to the housing portion 530, which are arrayed in this order from one end (on the left-hand side of FIG. 32) of the main body portion. The main body portion is provided for forming the probe of this embodiment, and the probe of this embodiment is produced by bending the main body portion multiple times.

Subsequently, in step S304, the main body portion is plated (plating step). This plating step is done by sequentially performing plating of Ni (nickel), plating of Pd (palladium), and plating of Au (gold) in this order. Alternatively, the plating step may be done by sequentially performing plating of Ni and plating of Au in this order.

Subsequently, in step S306, the portion of the sheet metal plate corresponding to the spring portion 520 is bent (first bending step). Specifically, the portion of the sheet metal plate corresponding to the spring portion 520 is bent by 90 degrees along the dotted line K1-K2 illustrated in FIG. 32, and further bent by 90 degrees along the dotted line K3-K4 in the same direction. Thereby, the portion of the sheet metal plate corresponding to the spring portion 520 is formed to have a rectangular cross-section.

The portion of the sheet metal plate corresponding to the spring portion 520 is formed to have a rectangular cross-section, and the surface formed by one side portion 521 of the spring portion 520 and the surface formed by the other side portion 522 of the spring portion 520 are substantially parallel to each other. At this time, the side portions on both sides of the terminal portion 510 are also bent by 90 degrees to form head-end reinforcing portions 512, and the portion of the sheet metal plate corresponding to the housing connecting portion 540 has a configuration which is in conformity with the configuration of the side portions 521 and 522 of the spring portion 520.

In the step S306, the side portions of the portion of the sheet metal plate corresponding to the housing portion 530 are bent by 90 degrees in the direction opposite to the bending direction of the spring portion 520 along the dotted line L1-L2 and the dotted line L3-L4 to form the portion of the sheet metal plate corresponding to the upper face portion 532, and further, the housing connecting portion 540 is slightly bent outside so that the housing connecting portion 540 and the internal walls of the housing portion 530 are in contact.

Subsequently, in step S308, the main body portion is bent (second bending step). Specifically the main body portion is bent by 180 degrees along the dotted line M1-M2 illustrated in FIG. 32, in the direction that is the same as the bending direction of the spring portion 520. The portion of the sheet metal plate which is bent along the dotted line M1-M2 corresponds to the curved portion 536, and this portion serves as a connection terminal when the probe of this embodiment is connected to the measuring instrument.

Subsequently, in step S310, the portion of the sheet metal plate corresponding to the housing portion 530 is bent (third bending step). Specifically, the portion of the sheet metal plate corresponding to the housing portion 530 is bent by 90 degrees along the dotted line N1-N2 illustrated in FIG. 32, in the direction that is the same as the bending direction of the spring portion 520, and further bent by 90 degrees along the dotted line N3-N4 to form the side portions 531 of the housing portion 530. At this time, the lower face portion 535 is also formed simultaneously. The probe of this embodiment has a configuration in which the whole spring portion 520 is surrounded by the housing portion 530. The housing spring portion 537 is formed to have a rectangular cross-section. The surface formed by one side portion 538 of the housing spring portion 537 and the surface formed by the other side portion 539 of the housing spring portion 537 are substantially parallel to each other. The housing connecting portion 540 and the internal wall of the side portion 531 of the housing portion 530 are in contact with each other to establish electrical connection.

As described above, the probe of this embodiment can be manufactured by press forming one sheet of a sheet-metal plate. It is not necessary to perform an assembly process in which two or more components are assembled together, in order to manufacture the probe having a spring function. The probe manufacturing method includes only the press forming of the sheet metal plate, the plating, and the bending. Hence, the probe can be manufactures using a simple manufacturing device, and the probe manufacturing method itself is simple. It is possible to manufacture a large number of probes speedily with low cost. Therefore, the probe having a spring function can be manufactured with low cost.

Figure 33:
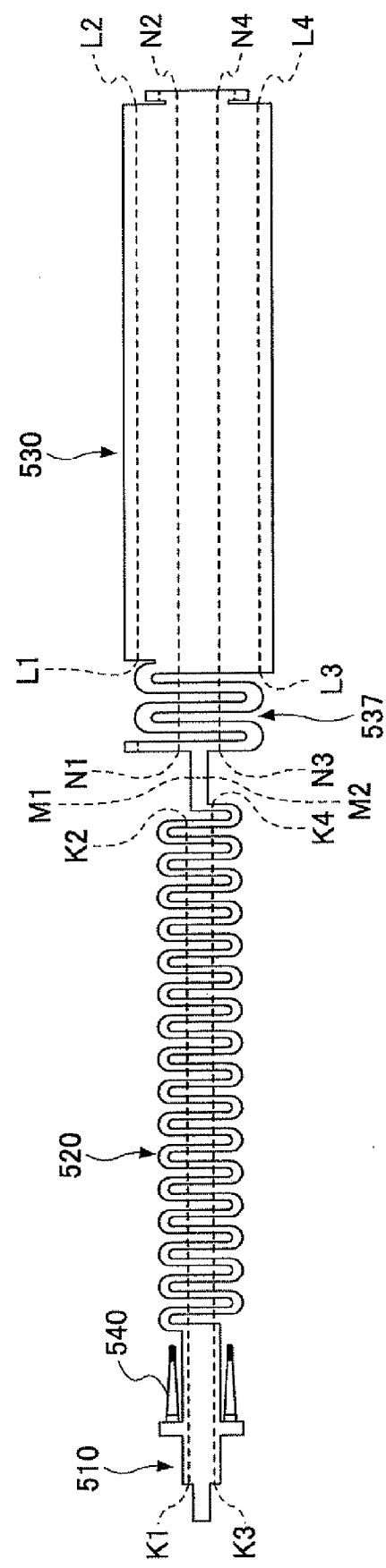
FIG. 33 is a diagram for explaining the method of manufacturing another probe of the sixth embodiment.

Similarly, the probe illustrated in FIG. 29 and FIG. 30 can be manufactured by bending the sheet metal plate illustrated in FIG. 33. In the method of manufacturing the probe described above, the sheet metal plate illustrated in FIG. 33 is formed in the step S302, and the bending of the sheet metal plate is performed in the steps S306 to S310, so that the probe illustrated in FIG. 29 and FIG. 30 can be manufactured. In FIG. 33, the bending lines along which the sheet metal plate is bent in the steps S306 to S310 are illustrated.

Next, a probe of a seventh embodiment of the present disclosure will be described.

The probe of this embodiment is used for inspecting an electronic part, an electric circuit, etc. The probe of this embodiment is electrically connected to an electrode pad or an electrode terminal formed on the electronic part, the electric circuit, etc.

Specifically, as illustrated in FIGS. 34 to 42, the probe of this embodiment is formed by press forming (punching and bending) one sheet of a sheet metal plate which is made of beryllium bronze which is an age-hardening type alloy. Therefore, the probe of this embodiment has a unified configuration in which the components of the probe are continuously linked together.

The probe of this embodiment is constituted to include a terminal portion 610, a spring portion 620, a housing portion 630, a housing connecting portion 640, and a curved portion 650.

Figure 34:
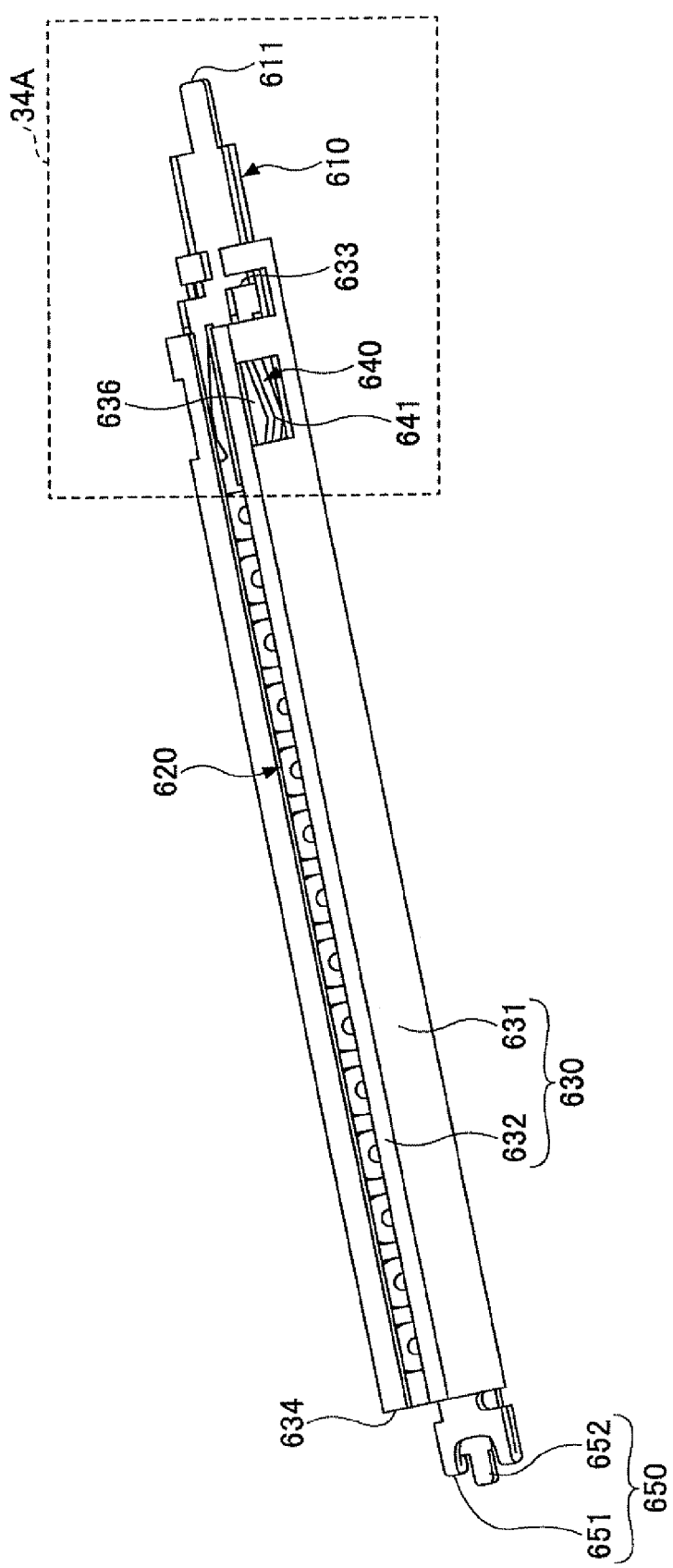
FIG. 34 is a perspective view of a probe of a seventh embodiment of the present disclosure.
Figure 35:
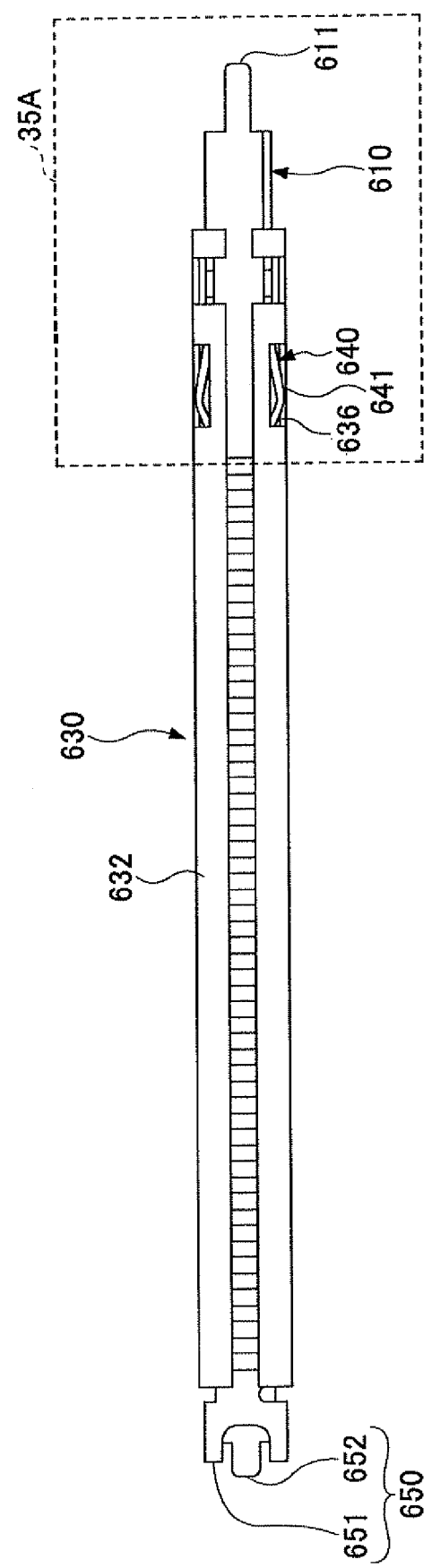
FIG. 35 is a top view of the probe of the seventh embodiment.
Figure 36:
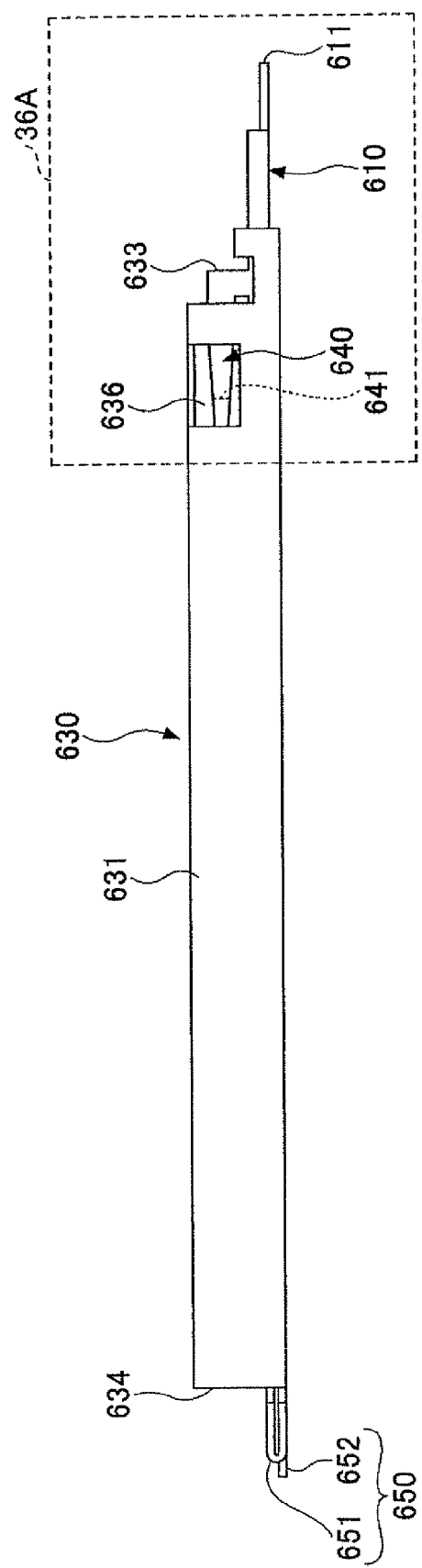
FIG. 36 is a left side view of the probe of the seventh embodiment.
Figure 37:
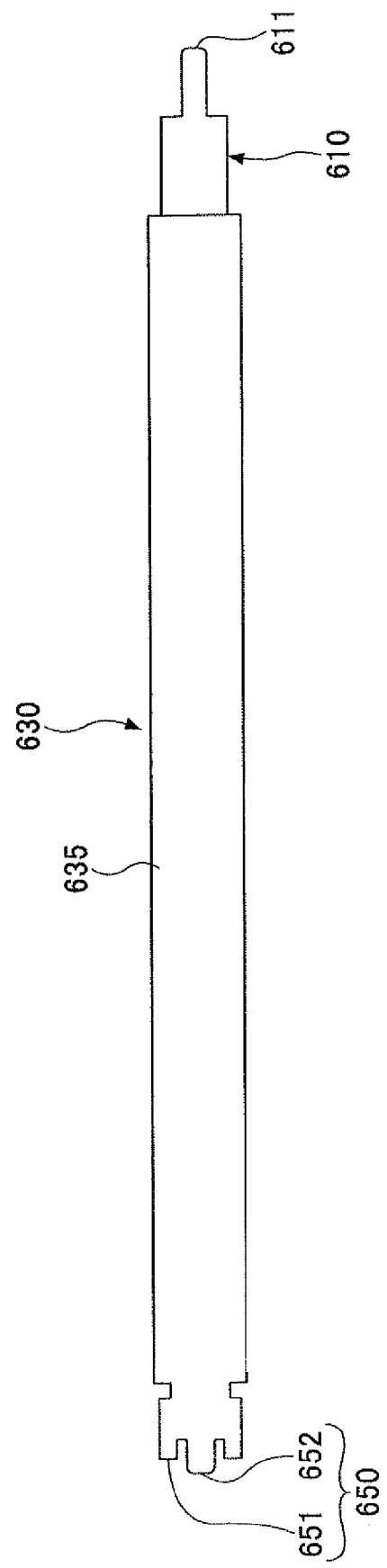
FIG. 37 is a bottom view of the probe of the seventh embodiment.
Figure 38:
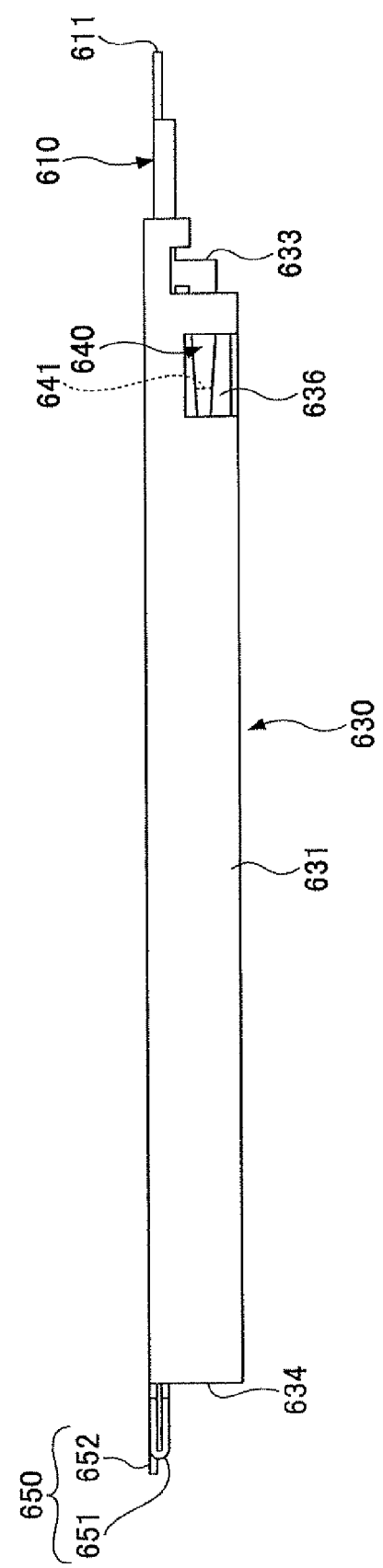
FIG. 38 is a right side view of the probe of the seventh embodiment.
Figure 39:
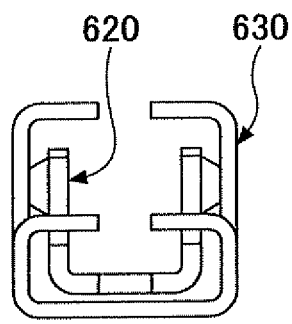
FIG. 39 is a diagram illustrating the composition of the probe of the seventh embodiment.
Figure 40:
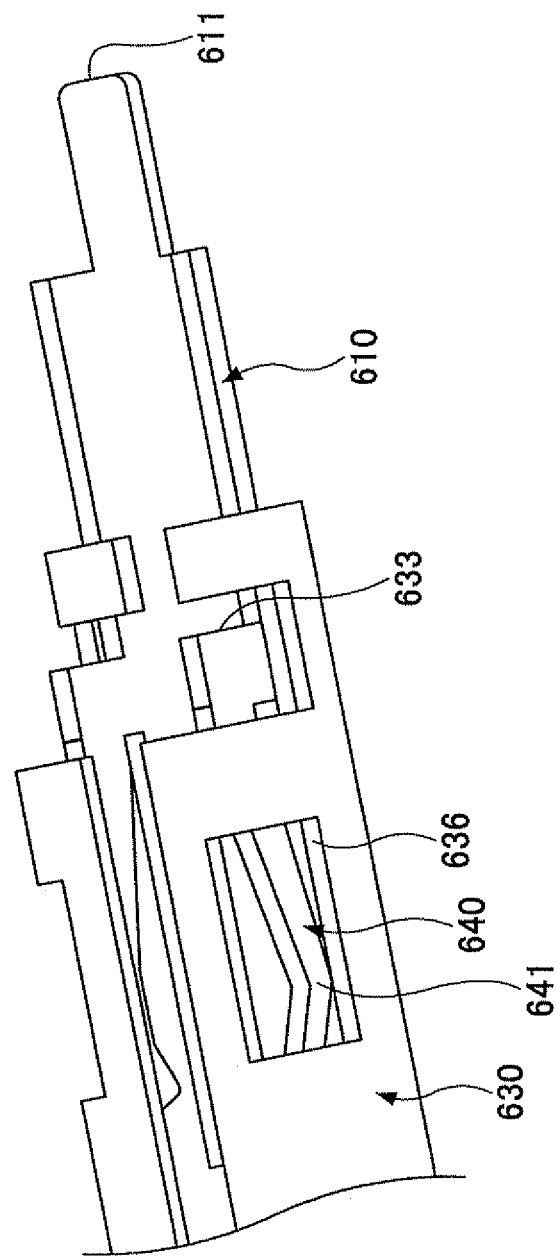
FIG. 40 is an enlarged view of the principal part of the probe of the seventh embodiment.
Figure 41:
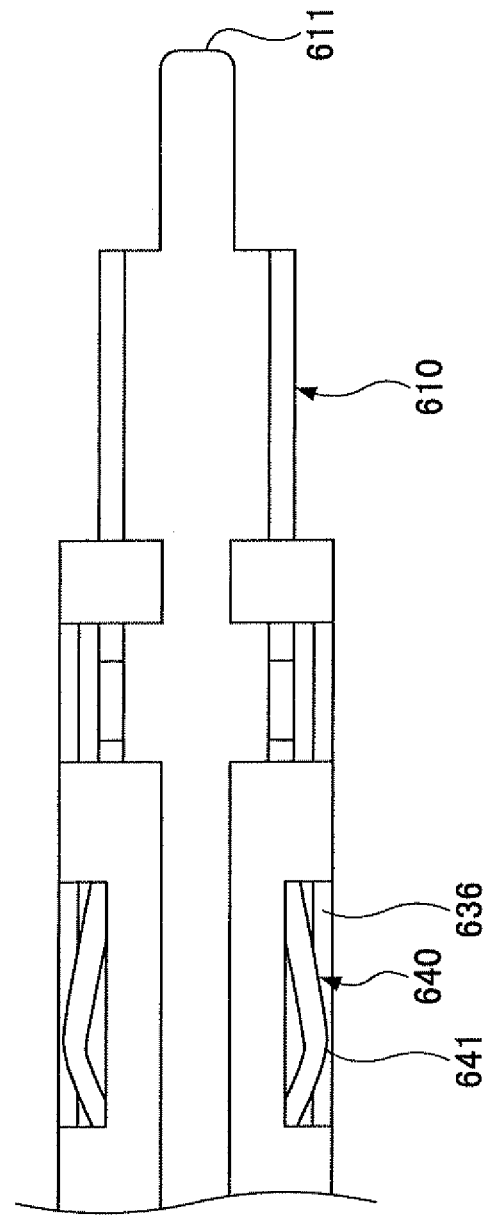
FIG. 41 is an enlarged view of the principal part of the probe of the seventh embodiment.
Figure 42:
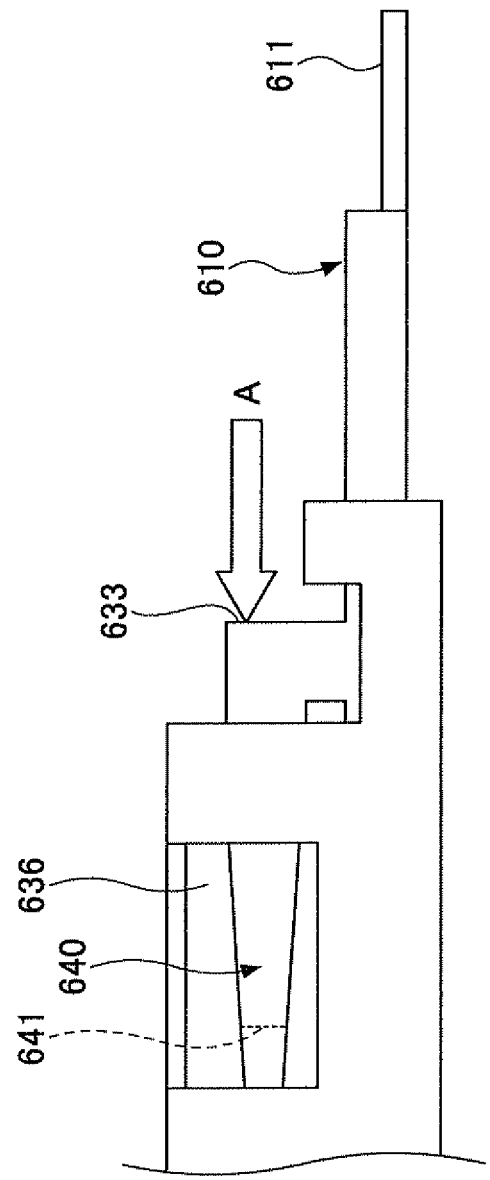
FIG. 42 is an enlarged view of the principal part of the probe of the seventh embodiment.

FIG. 34 is a perspective view of the probe of this embodiment, FIG. 35 is a top view of the probe of this embodiment, FIG. 36 is a left side view of the probe of this embodiment, FIG. 37 is a bottom view of the probe of this embodiment, FIG. 38 is a right side view of the probe of this embodiment, and FIG. 39 is a front view of the probe of this embodiment. FIG. 40 is an enlarged view of a portion 34A indicated by the dotted line in FIG. 34, FIG. 41 is an enlarged view of a portion 35A indicated by the dotted line in FIG. 35, and FIG. 42 is an enlarged view of a portion 36A indicated by the dotted line in FIG. 36.

In this embodiment, the terminal portion 610 is to be in contact with an electrode pad or an electrode terminal of an electric circuit or an electronic part fabricated on a wafer to establish electrical connection. One end of the terminal portion 610 is provided to form a terminal contact portion 611. This terminal contact portion 611 is brought in contact with the electrode pad or the electrode terminal of the electric circuit or the electronic part, which is the object of inspection, to establish electrical connection.

The spring portion 620 has a configuration which is formed by bending a sheet metal plate with U-shaped unit portions being arrayed in the longitudinal direction in a zigzag formation, along two longitudinal lines of the spring portion 620 to have a rectangular cross-section, and one side portion and the other side portion of the spring portion 620 are substantially parallel to each other.

In this embodiment, the spring portion 620 is formed to have a rectangular cross-section. Alternatively, the spring portion 620 may be formed to have a U-shaped cross-section. The spring portion 620 in this embodiment has the configuration in which the U-shaped unit portions are arrayed on the sides thereof in a zigzag formation, the spring portion 620 has elasticity and functions as a spring that can be resiliently deformed.

The housing portion 630 is formed to surround the whole spring portion 620 by bending the portion of the sheet metal plate corresponding to the housing portion 630. Specifically, a side portion 631 and an upper face portion 632 are formed by bending the portion of the sheet metal plate corresponding to the housing portion 630.

The upper face portion 632 is formed by bending the side portion of the portion of the sheet metal plate corresponding to the housing portion 630, and a lower face portion 635 is also formed by bending the side portion 631, so that the whole spring portion 620 can be surrounded by the housing portion 630 having a generally rectangular cross-section.

An opening 636 is formed in the housing portion 630, and in the condition that external force is not exerted to the probe of this embodiment, a contact portion 641 is located in the opening 636 of the housing portion 630.

The housing portion 630 and the spring portions 620 are bent by about 180 degrees at the curved portion 650 corresponding to the boundary therebetween, and the spring portion 620 is accommodated in the housing portion 630. The curved portion 650 is electrically connected to the measuring instrument, such as a prober, and an electrode signal obtained when the terminal contact portion 611 is made to contact the electrode pad or the electrode terminal is transmitted to the measuring instrument via the curved portion 650.

In this embodiment, the curved portion 650 includes a bent portion 651 and an electrode contact portion 652, the electrode contact portion 652 is brought in contact with an electrode terminal of the measuring instrument, and the electrode signal is transmitted to the measuring instrument via the electrode contact portion 652.

Figure 43:
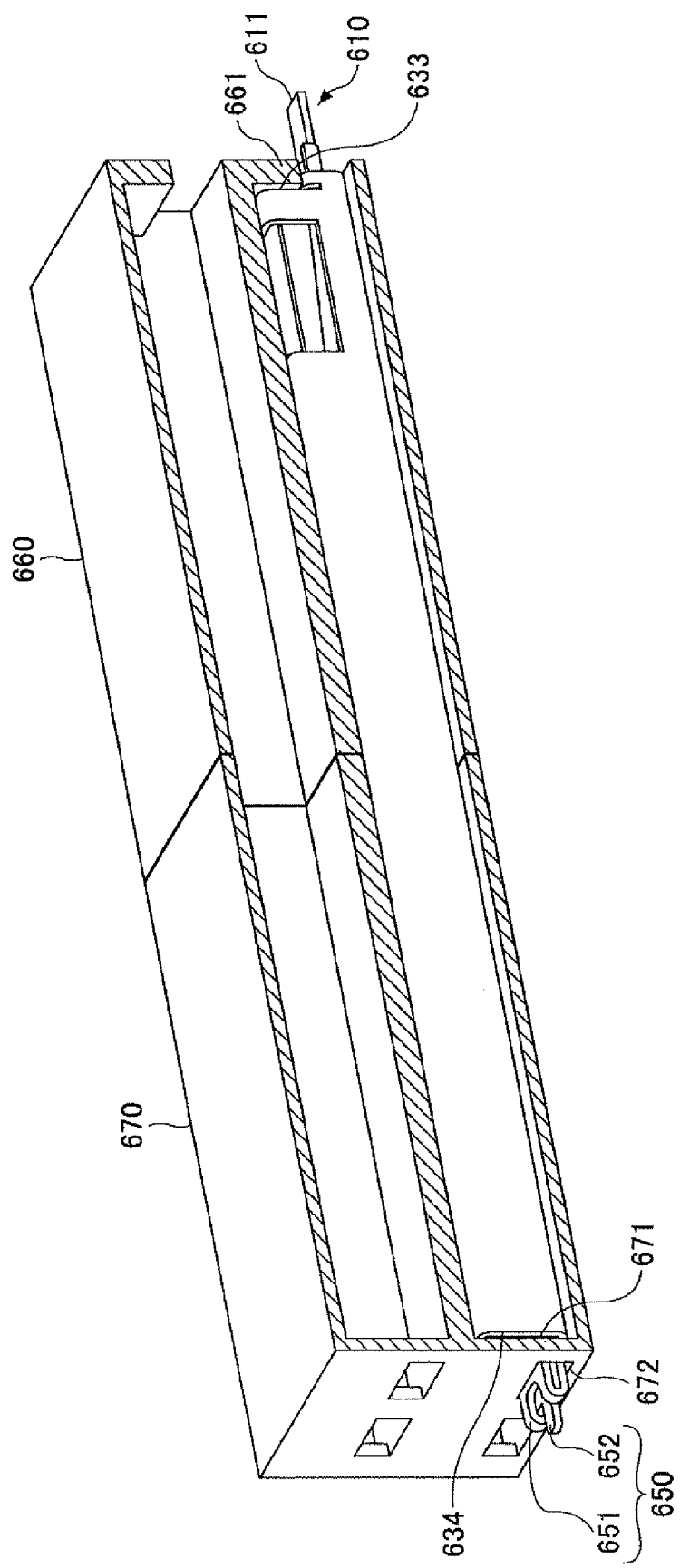
FIG. 43 is a perspective view of a condition of use of the probe of the seventh embodiment.

The housing connecting portion 640 includes a contact portion 641 which is in contact with the internal wall of the side portion 631 of the housing portion 630 when the probe is installed in insulation frames 660 and 670 as illustrated in FIG. 43. That is, as illustrated in FIG. 40, the contact portion 641 is formed in a crest-like formation and has a spring function.

Therefore, the housing connecting portion 640 and the housing portion 630 are electrically connected via the contact portion 641 when the probe is installed in the insulation frames 660 and 670. Thus, the housing connecting portion 640 and the housing portion 630 are electrically connected via the contact portion 641, and an electrical signal from the terminal contact portion 611 is transmitted to the curved portion 650 via the terminal portion 610, the housing connecting portion 640, and the housing portion 630.

Because the housing portion 630 has a large cross-sectional area in the portion through which the electrical signal flows, the electric resistance from the terminal contact portion 611 to the curved portion 650 can be lowered. Therefore, the electrical signal from the terminal contact portion 611 can be transmitted to the curved portion 650 with a low resistance. Namely, in the probe of this embodiment, the portions electrically connected with the probe are only the housing portion 630 and the contact portion 641 of the housing connecting portion 640, and the contact resistance can be reduced.

Next, the manner of use of the probe of this embodiment will be described.

The probes of this embodiment are installed in the insulation frames 660 and 670 and arranged at generally equal intervals in a two-dimensional formation. Specifically, in one of the probes of this embodiment, a connecting front portion 633 is provided on the side where the terminal portion 610 is provided, and disposed between the terminal portion 610 and the spring portion 620. A connecting rear portion 634 is provided at the end portion where a curved portion 650 is formed in the housing portion 630.

As illustrated in FIG. 43, when the plural probes of this embodiment are arranged in the insulation frames 660 and 670 in a two-dimensional formation, the connecting front portion 633 of each probe of this embodiment and the holding portion 661 of the insulation frame 660 are in contact, the connecting rear portion 634 and the holding portion 671 of the insulation frame 670 are in contact, and the insulation frame 660 and the insulation frame 670 are joined together. Thereby, the force is exerted through the holding portion 661 and the holding portion 671 in the direction in which the connecting front portion 633 and the connecting rear portion 634 are compressed, i.e., in the direction in which the spring portion 620 of each probe shrinks.

Because the spring portion 620 can be resiliently deformed (or having the spring function), the probes of this embodiment are fixed to the insulation frames 660 and 670 by this force. When the terminal contact portion 611 in the terminal portion 610 of each probe contacts an electrode pad or an electrode terminal in this condition, it is possible to make it contact with the spring function of the spring portion 620.

The curved portion 650 is projecting to the outside of the opening 672 which is formed in the insulation frame 670, and it is possible to electrically connect the electrode contact portion 652 of the curved portion 650 and the electrode terminal.

When the probe is not installed in the insulation frames 660 and 670, or when the probe is in a condition that external force is not exerted on the contact front portion 633, the contact portion 641 of the housing connecting portion 640 of the probe of this embodiment is located in the opening 636 of the housing portion 630, and the housing portion 630 and the contact portion 641 of the housing connecting portion 640 are not in contact. This structure results from the method of manufacturing the probe of this embodiment which will be described later. In this condition, the contact portion 641 projects toward the opening 636.

As described above, when the probe of this embodiment is installed in the insulation frames 660 and 670, the housing portion 630 and the contact portion 641 of the housing connecting portion 640 are in contact. That is, when the probe of this embodiment is installed in the insulation frames 660 and 670, as illustrated in FIG. 42, the connecting front portion 633 is pushed in the direction indicated by the arrow A in FIG. 42 by the holding portion 661 of the insulation frame 660.

Thereby, the spring portion 620 is compressed, the connecting front portion 633 is pushed to the housing portion 630 side, and the housing connecting portion 640 is moved from the opening 636 to enter the inner portion of the housing portion 630, so that the contact portion 641 of the housing connecting portion 640 contacts the housing portion 630.

Figure 44:
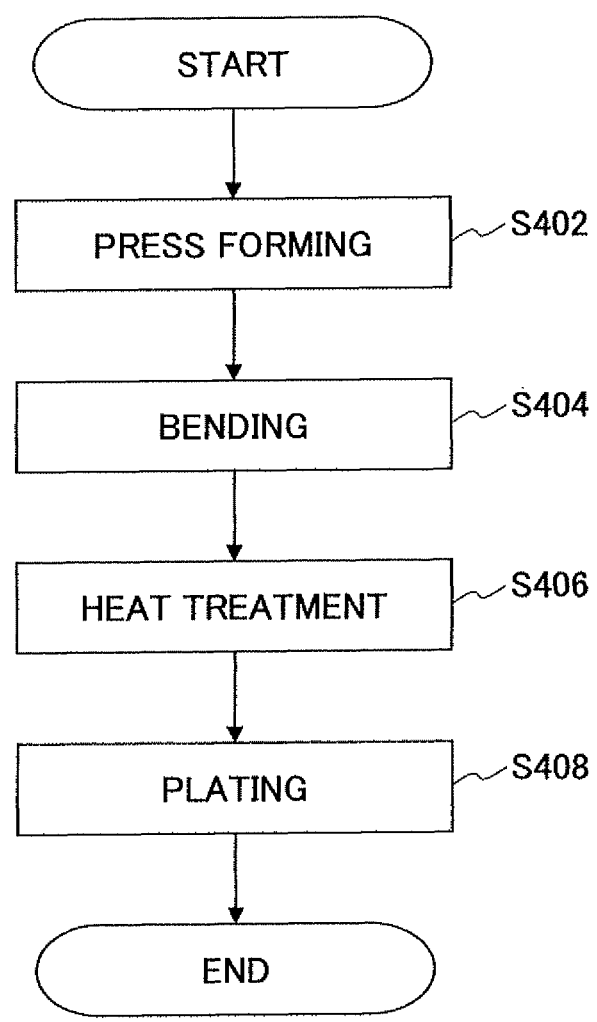
FIG. 44 is a flowchart for explaining a method of manufacturing the probe of the seventh embodiment.

Next, a method of manufacturing the probe of this embodiment will be described with reference to FIG. 44.

Upon start of the method of manufacturing the probe of this embodiment, in step S402, a sheet metal plate having a predetermined configuration is formed (metal plate forming step). This sheet metal plate may be formed by press forming (punching and bending). This sheet metal plate is made of beryllium bronze or a material containing beryllium bronze and a thickness of the sheet metal plate is in a range of 30 micrometers-150 micrometers.

In this embodiment, the sheet metal plate having the predetermined configuration is formed by press forming a blank sheet metal plate of beryllium bronze having a thickness of 60 micrometers.

Figure 45:
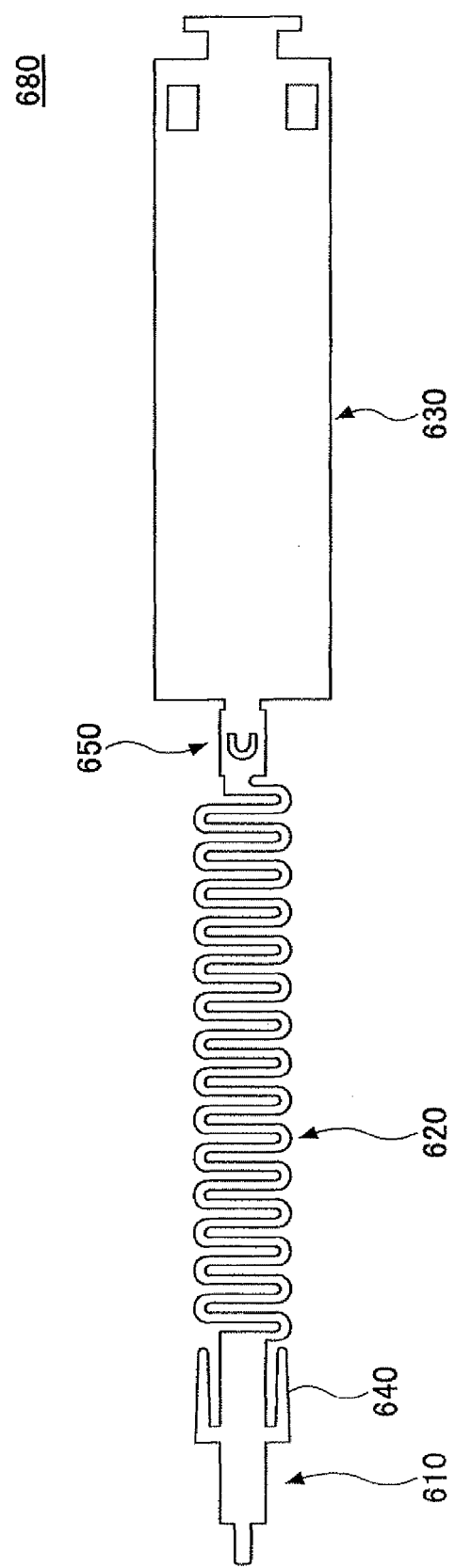
FIG. 45 is a diagram for explaining the method of manufacturing the probe of the seventh embodiment.

FIG. 45 illustrates an example of the sheet metal plate 680 which is formed to have the predetermined configuration. This sheet metal plate 680 of FIG. 45 is in a punched condition after the punching is performed. The main body portion of this sheet metal plate 680 includes the terminal portion 610, the spring portion 620, the housing portion 630, the housing connecting portion 640, and the curved portion 650, which are formed in the non-bent condition prior to the subsequent bending. The probe of this embodiment is produced by bending the sheet metal plate 680 in this condition.

Subsequently, in step S404, bending of the sheet metal plate 680 is performed. Specifically, the bending of the sheet metal plate 680 is performed by the method that is the same as that of the first embodiment described above. By performing the bending, the sheet metal plate 680 is formed to have the configuration as illustrated in FIGS. 34-42.

Subsequently, in step S406, the heat treatment of the sheet metal plate 680 is performed (heat treatment step). Specifically, the heat treatment is performed for about 2 hours at a temperature of 270 degrees C. The probe of this embodiment is made of beryllium bronze which is an age-hardening type alloy. The beryllium bronze (age-hardening type alloy) can be hardened by heat treatment. Thereby, a probe with good strength can be produced.

In this embodiment, the heat treatment step is performed after the bending step is performed. This is because the sheet metal plate of beryllium bronze before the heat treatment is performed is soft and can be easily press formed. After the heat treatment is performed, the sheet metal plate of beryllium bronze becomes hard and it is difficult to perform the bending step.

The optimal temperature and time of the heat treatment may be appropriately determined depending on the kind and composition of the age-hardening type alloy. The heat treatment temperature in this embodiment is preferably in a range of 250 degrees C. to 400 degrees C., and it is more preferably in a range of 250 degrees C. to 315 degrees C. The heat treatment time in this embodiment is preferably in a range of 1 hour to 5 hours, and it is more preferably in a range of 1 hour to 3 hours.

Subsequently, in step S408, the plating of the sheet metal plate 680 is performed (plating step). The plating step is done by sequentially performing plating of Ni (nickel), plating of Pd (palladium), and plating of Au (gold). Alternatively, the plating step may be done by performing plating of Ni (nickel) and plating of Au (gold) in this order.

The sheet metal plate 680 which is bent in the step S404 is in the condition in which the contact portion 641 of the housing connecting portion 640 is located in the opening 636 of the housing portion 630.

The sheet metal plate 680 made of beryllium bronze has a characteristic in which the configuration is fixed by the heat treatment. That is, when the beryllium bronze is heat-treated, the configuration is fixed although the spring function of the probe is maintained. If the heat treatment step is performed in the condition that the housing portion 630 and the contact portion 641 of the housing connecting portion 640 are in contact, the configuration of the probe will be fixed in such a condition, and it will be difficult to produce the housing connecting portion 640 having the spring function. If the plating step is performed in the condition that the housing portion 630 and the contact portion 641 of the housing connecting portion 640 are in contact, the contact portion 641 and the housing portion 630 will be bonded together by the plating, and the resilience of the terminal portion 610 to the housing portion 630 will be lost.

For this reason, it is preferred in the probe of this embodiment that, when external force is not applied, the contact portion 641 is located in the opening 636, and the heat treatment step and the plating step are performed after the bending step is performed.

As described above, the probe of this embodiment can be manufactured by press forming one sheet of a sheet-metal plate of a beryllium bronze alloy. It is not necessary to perform an assembly process in which two or more components are assembled together, in order to manufacture the probe having a spring function. The probe manufacturing method includes only the press forming of the sheet metal plate, the plating thereof, the bending thereof, and the heat treatment thereof. Hence, the probe can be manufactured using a simple manufacturing device, and the probe manufacturing method itself is simple. Therefore, the probe having a spring function can be speedily manufactured in large quantities with low cost.

Next, a probe of an eighth embodiment of the present disclosure will be described.

The probe of this embodiment is used for inspecting an electronic part, an electric circuit, etc. The probe of this embodiment is electrically connected with an electrode pad or an electrode terminal formed on the electronic part, the electric circuit, etc.

Specifically, as illustrated in FIGS. 46-53, the probe of this embodiment is formed by bending one sheet of a sheet-metal plate. Therefore, the probe of this embodiment has a unified configuration in which the components of the probe are continuously linked together.

Figure 46:
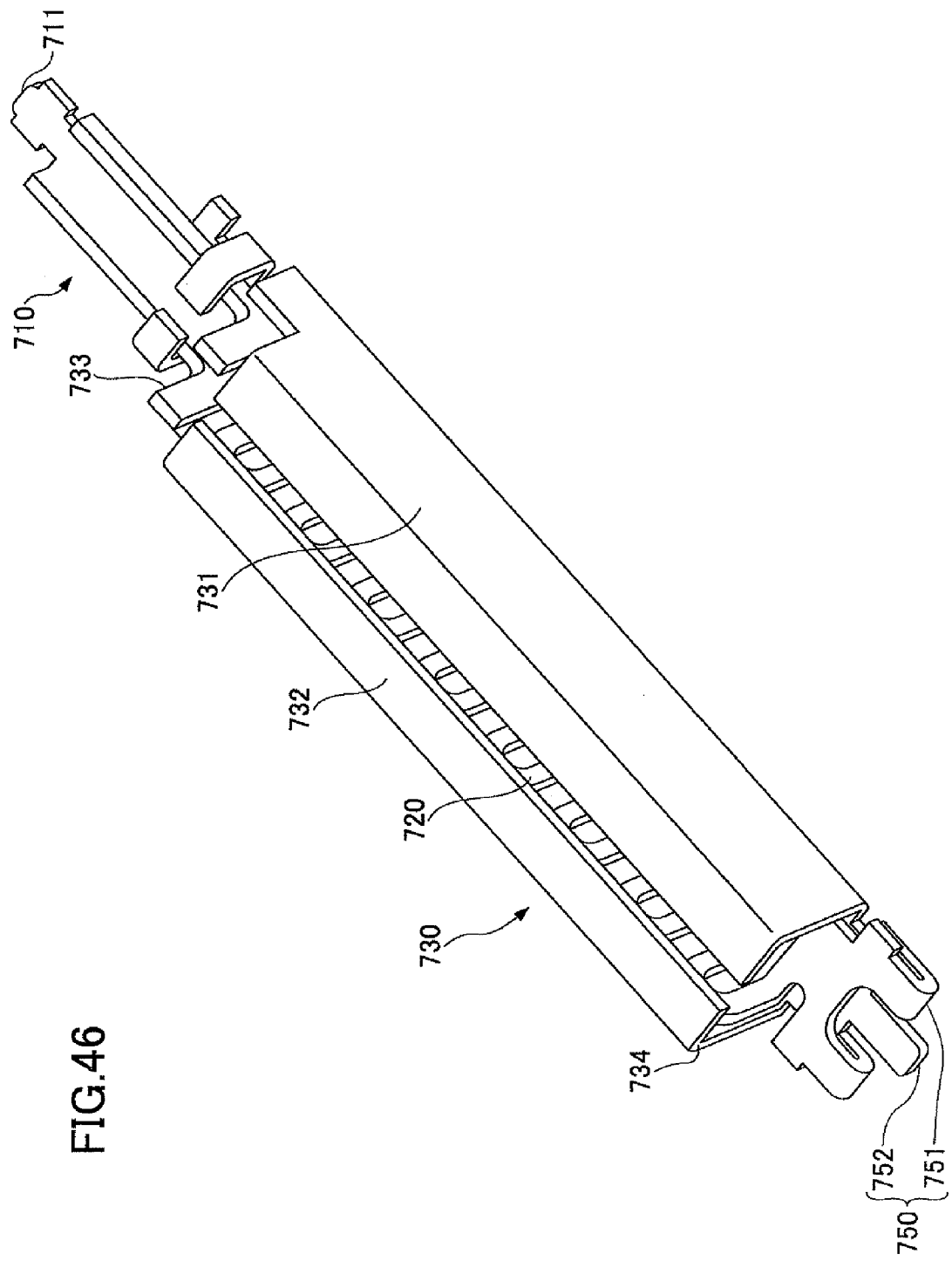
FIG. 46 is a perspective view of a probe of an eighth embodiment of the present disclosure.
Figure 47:
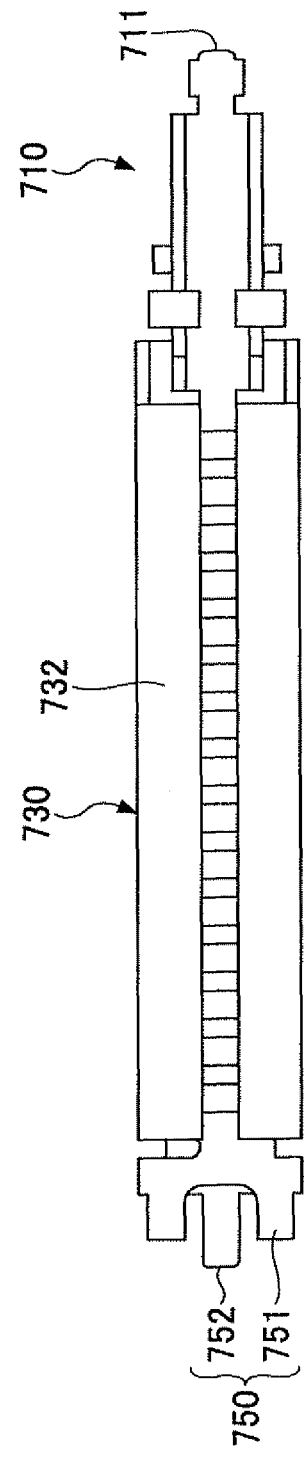
FIG. 47 is a top view of the probe of the eighth embodiment
Figure 48:
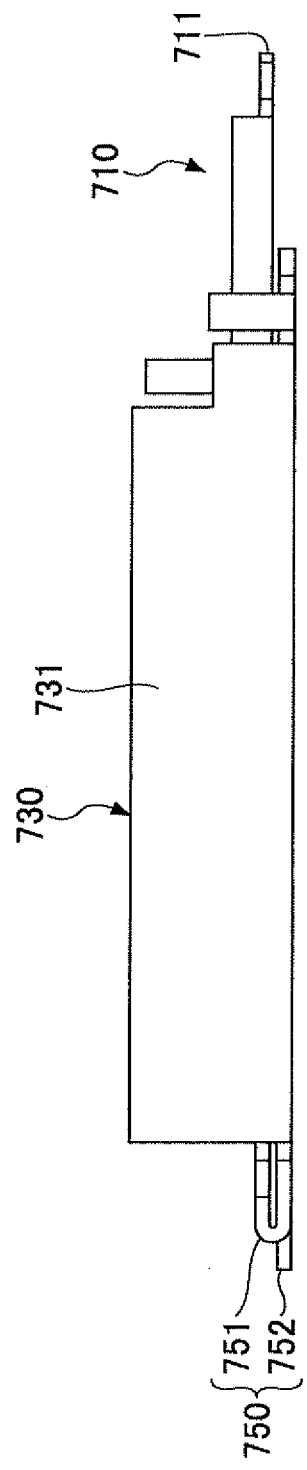
FIG. 48 is a left side view of the probe of the eighth embodiment.
Figure 49:
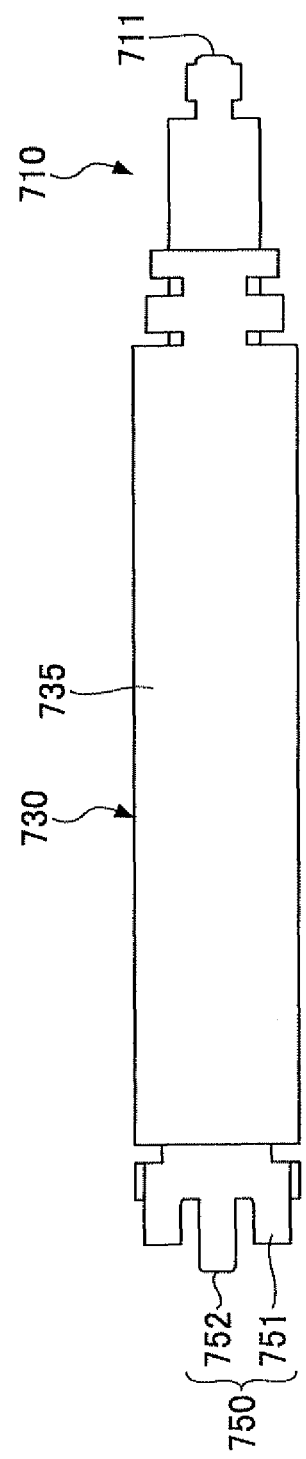
FIG. 49 is a bottom view of the probe of the eighth embodiment.
Figure 50:
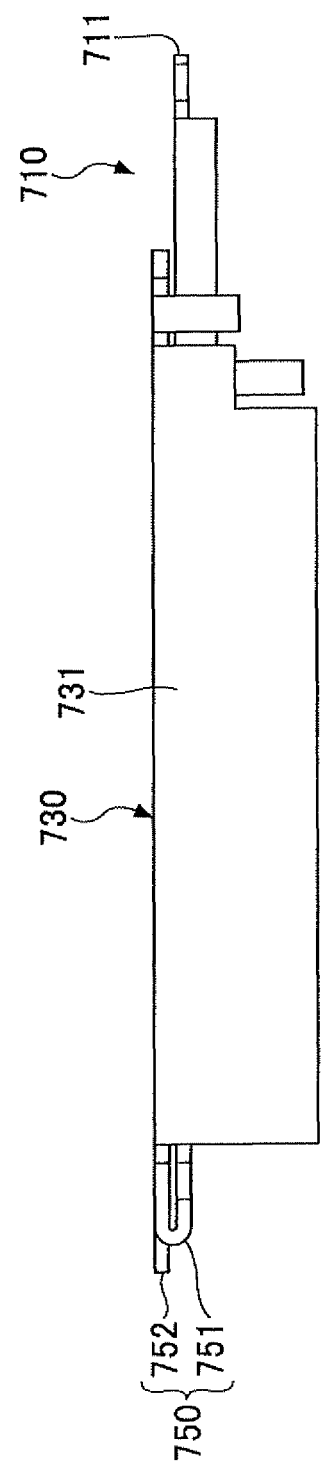
FIG. 50 is a right side view of the probe of the eighth embodiment.
Figure 51:
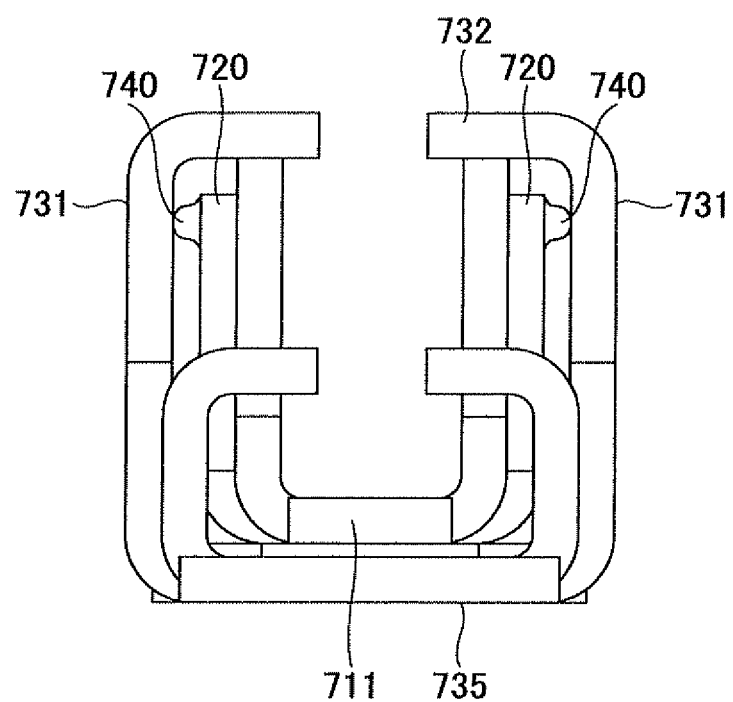
FIG. 51 is a diagram illustrating the whole surface of the probe of the eighth embodiment.
Figure 52:
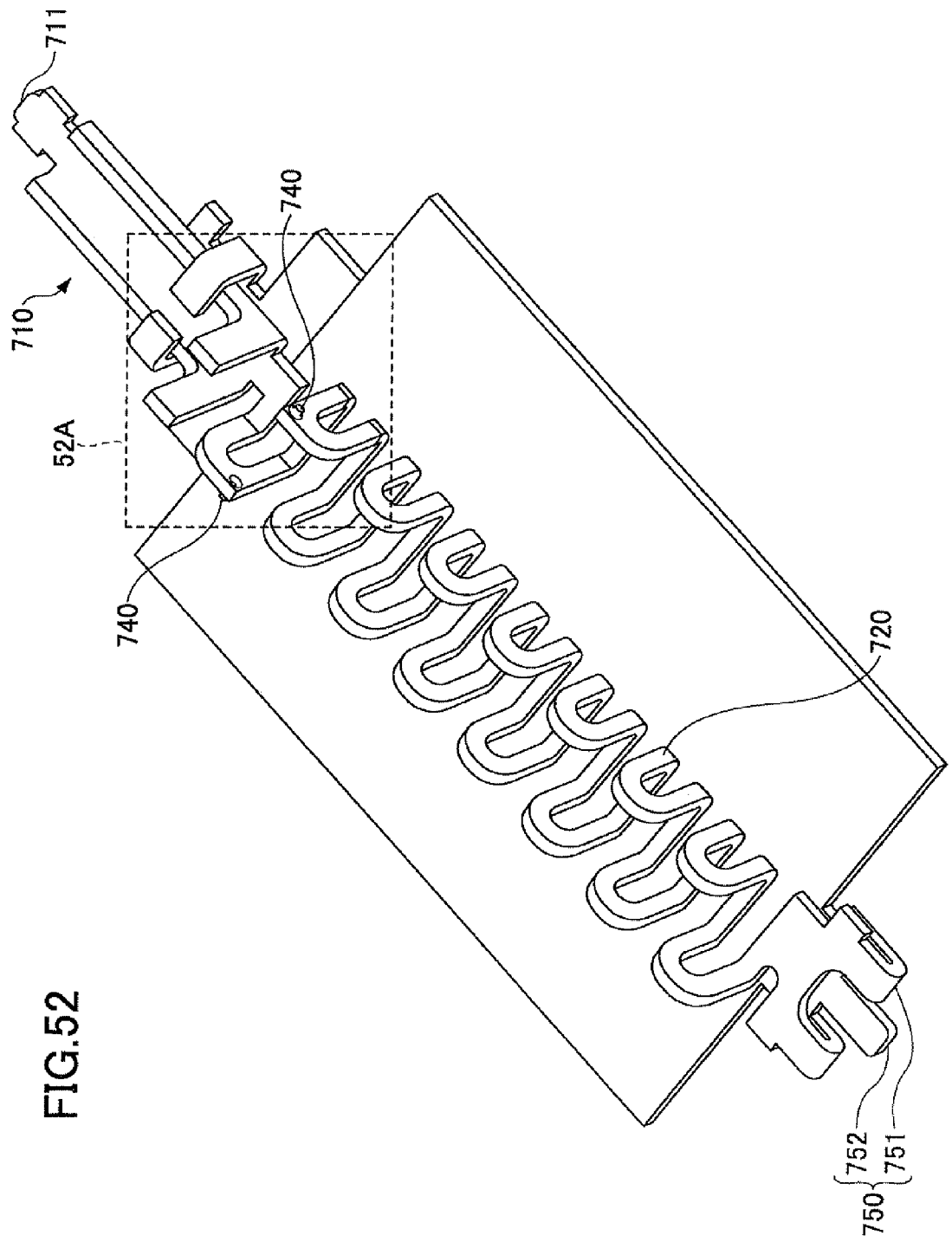
FIG. 52 is a diagram for explaining the probe of the eighth embodiment.
Figure 53:
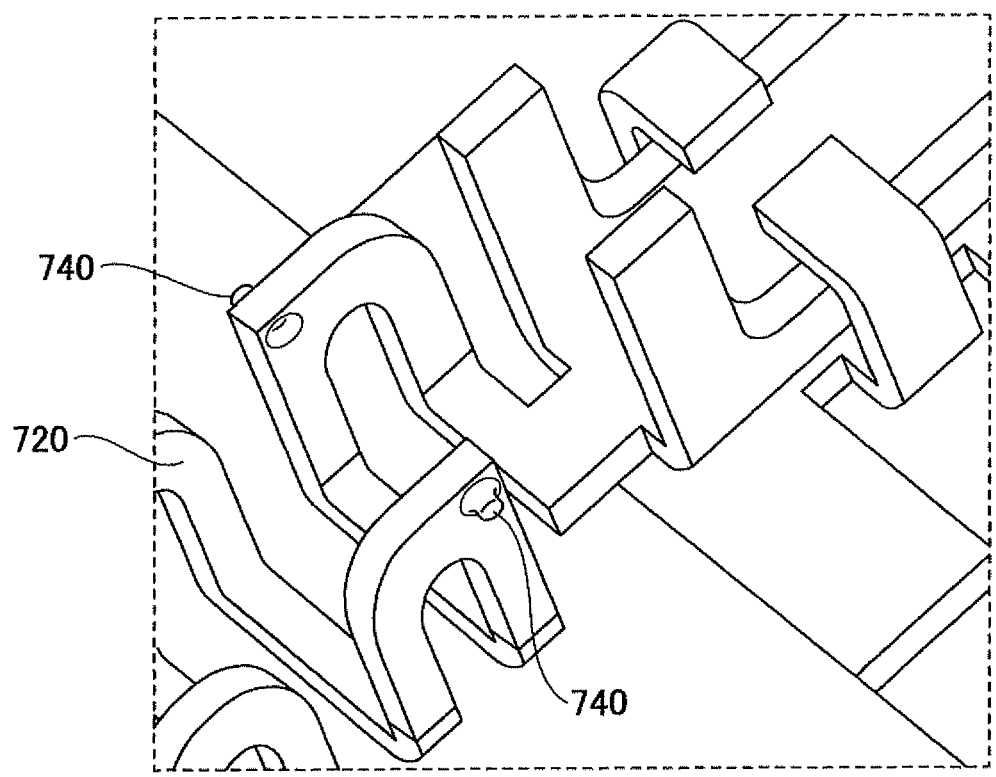
FIG. 53 is an enlarged view of the principal part of the probe of the eighth embodiment.

The probe of this embodiment is constituted to include a terminal portion 710, a spring portion 720, a housing portion 730, and a curved portion 750. FIG. 46 is a perspective view of the probe of this embodiment, FIG. 47 is a top view of the probe of this embodiment, FIG. 48 is a left side view of the probe of this embodiment, FIG. 49 is a bottom view of the probe of this embodiment, FIG. 50 is a right side view of the probe of this embodiment, and FIG. 51 is a front view of the probe of this embodiment. FIG. 52 illustrates the condition of the probe before the housing portion 730 is bent, and FIG. 53 is an enlarged view of a portion 52A of the probe indicated by the dotted line in FIG. 52.

In this embodiment, the terminal portion 710 is to be in contact with an electrode pad or an electrode terminal of an electric circuit or an electronic part fabricated on a wafer to establish electrical connection. One end of the terminal portion 710 is provided to form a terminal contact portion 711. This terminal contact portion 711 is brought in contact with the electrode pad or the electrode terminal of the electric circuit or the electronic part, which is the object of inspection, to establish electrical connection.

The spring portion 720 has a configuration which is formed by bending a sheet-metal plate with U-shaped unit portions being arrayed in the longitudinal direction in a zigzag formation, along two longitudinal lines in the central area of the spring portion 720 to have a rectangular cross-section, and one side portion and the other side portion of the spring portion 720 which are formed as a result of the bending are substantially parallel to each other.

In this embodiment, the spring portion 720 is formed to have a rectangular cross-section. Alternatively, the spring portion 720 may be formed to have a U-shaped cross-section. The spring portion 720 in this embodiment has the configuration in which the U-shaped unit portions are arrayed on the sides thereof in a zigzag formation, and the spring portion 720 has elasticity and functions as a spring that can be resiliently deformed.

The housing portion 730 is formed to surround the whole spring portion 720 by bending the portion of the sheet metal plate corresponding to the housing portion 730. Specifically, the portion of the sheet metal plate corresponding to the housing portion 730 is bent along two bending lines to form a side portion 731 and an upper face portion 732.

In the housing portion 730, the upper face portion 732 is formed by bending the side portion of the portion of the sheet metal plate corresponding to the housing portion 730, and the lower face portion 735 is also formed by bending the side portion 731, so that the whole spring portion 720 can be surrounded by the housing portion 730 having a generally rectangular cross-section.

The housing portion 730 and the spring portions 720 are bent by about 180 degrees at the curved portion 750 corresponding to the boundary therebetween and the spring portion 720 is accommodated in the housing portion 730. The curved portion 750 is electrically connected to a measuring instrument, such as a prober, and an electrode signal obtained when the terminal contact portion 711 is made to contact the electrode pad or the electrode terminal is transmitted to the measuring instrument via the curved portion 750. In this embodiment, the curved portion 750 includes a bent portion 751 and an electrode contact portion 752, the electrode contact portion 752 is brought in contact with an electrode terminal of the measuring instrument, and the electrode signal is transmitted to the measuring instrument via the electrode contact portion 752.

In this embodiment, convex portions 740 which are configured to project to the housing portion 730 are formed in the spring portion 740 in the vicinity of the terminal portion 710. The convex portions 740 are formed by applying the force in the direction from the inside to the outside at the predetermined locations of the spring portion 720.

When the housing portion 730 in the condition as illustrated in FIG. 52 is bent to the condition as illustrated in FIG. 46, the convex portions 740 are formed so that the convex portions 740 and the internal walls of the side portion 731 of the housing portion 730 are in contact with each other. The internal walls of the housing portion 730 and the convex portions 740 are in contact, and they are electrically connected with each other.

Because the internal walls of the housing portion 730 and the convex portions 740 are electrically connected with each other, an electrical signal from the terminal contact portion 711 of the terminal portion 710 is transmitted to the curved portion 750 via the convex portions 740 provided on the side faces of the spring portion 720 and via the housing portion 730.

The housing portion 730 has a large cross-sectional area in the portion through which the electrical signal flows, and the electric resistance from the terminal contact portion 711 to the curved portion 750 can be lowered. Therefore, the electrical signal from the terminal contact portion 711 can be transmitted to the curved portion 750 with a low resistance. Namely, in the probe of this embodiment, the portions electrically connected with the probe are only the internal walls of the side portion 731 of the housing portion 730 and the convex portions 740 provided on the spring portion 720, and the contact resistance of the probe can be lowered.

It is preferred that the convex portions 740 are provided on the spring portion 720 in the vicinity of the terminal portion 710. The housing portion 730 has a large cross-sectional area in the portion through which the electrical signal flows, and the current can be supplied with a low resistance. It is preferred that the electrical signal from the contact terminal portion 711 is transmitted through the housing portion 730, in order to transmit the electrical signal with a low resistance.

It is preferred that the convex portions 740 are provided on the both sides of the spring portion 720. Specifically, one of the convex portions 740 is formed on one side portion of the spring portion 720 in the bent condition, and the other convex portion 740 is formed on the other side portion of the spring portion 720. The former convex, portion 740 on the one side portion of the spring portion 720 is in contact with the internal wall of one of the side portions 731 of the housing portion 730, while the latter convex portion 740 on the other side portion of the spring portion 720 is in contact with the internal wall of the other side portion 731 of the housing portion 730.

In this manner, the convex portions 740 are formed on the both sides of the spring portion 720, the convex portions 740 and the housing portion 730 can be reliably made to contact each other. At this time, as illustrated in FIG. 53, it is preferred that the convex portions 740 are provided at the symmetrical locations in the spring portion 720. In this case, the convex portions 740 and the internal walls of the side portions 731 of the housing portion 730 can be more reliably made to contact each other.

Moreover, the probe of this embodiment before the spring portion 720 is bent is in a plate-like condition. When the spring portion 720 is formed by the bending, the probe of this embodiment has the spring function in the bending direction. Therefore, when the spring portion 720 is formed into a predetermined configuration by the bending, the convex portion 740 can be reliably made to contact the internal wall of the side portion 731 of the housing portion 720 where an external force is exerted. For this reason, even when the terminal contact portion 711 of the terminal portion 710 is made to contact an electrode or a terminal provided in a substrate, the spring portion 720 can be resiliently deformed while the condition is maintained that the convex portion 740 is in contact with the internal wall of the side portion 731 of the housing portion 730.

As described above, the probe of this embodiment has the configuration in which the convex portions 740 contact the internal walls of the side portions 731 of the housing portion 730, and miniaturization of the probe is possible.

Figure 54:
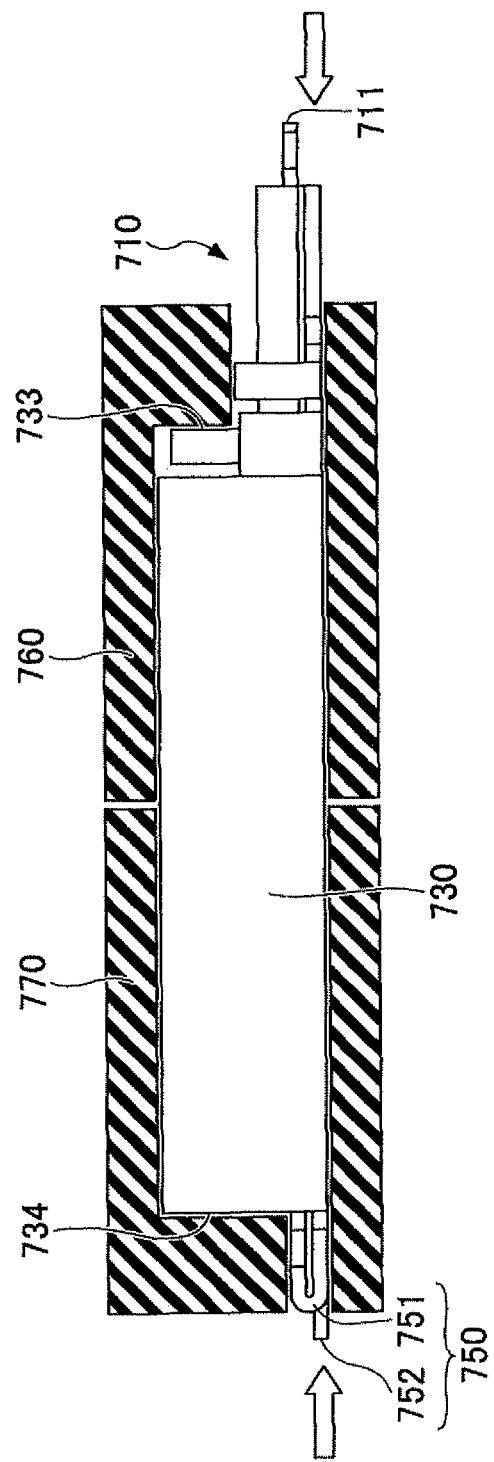
FIG. 54 is a diagram for explaining a condition of use of the probe of the eighth embodiment.

Next, the condition of use of the probe of this embodiment will be described with reference to FIG. 54. When the probe of this embodiment is used, the probe is installed in insulation frames 760 and 770. Specifically, a connecting rear portion 734 is provided in the housing portion 730 of the probe of this embodiment and a connecting front portion 733 is provided between the terminal portion 710 and the spring portion 720. When installing the probe of this embodiment in the insulation frames 760 and 770, the connecting rear portion 734 is made to contact the internal wall of the insulation frame 770, the connecting front portion 733 is made to contact the internal wall of the insulation frame 760, and the insulation frame 770 and the insulation frame 760 are connected together. Then, the probe of this embodiment is installed in the insulation frames 760 and 770.

In the foregoing embodiments, the housing portion has a generally rectangular cross-section. Alternatively, the housing portion may be formed to have a circular cross-section, an elliptical cross-section, a triangular cross-section, or a polygonal cross-section.

The probes of the foregoing embodiments may be used in a memory circuit tester, the testing of a liquid crystal panel, the testing of a substrate, etc., and may be used as an alternative of a probe pin called a pogo-pin.

As described in the foregoing, the probe according to the present disclosure can be manufactured by press forming one sheet of a sheet-metal plate, and it is not necessary to perform an assembly process for the manufacture. It is possible to provide a probe for electrical connection which has a spring function and can be speedily manufactured with low cost.

The present disclosure is not limited to the above-described embodiments, and variations and modifications may be made without departing from the scope of the present invention.

The present application is based on Japanese patent application No. 2009-203849, filed on Sep. 3, 2009, Japanese patent application No. 2009-228696, filed on Sep. 30, 2009, Japanese patent application No. 2010-082699, filed on Mar. 31, 2010, and Japanese patent application No. 2010-160069, filed on Jul. 14, 2010, the entire contents of which are incorporated herein by reference in their entirety.

What is claimed is:

1. A probe which is made to contact an electrode terminal in an electric circuit or an electronic part for an electric measurement of the electric circuit or the electronic part, the probe comprising:

a terminal portion which is brought in contact with the electrode terminal;

a spring portion provided to the terminal portion and having U-shaped unit portions arrayed in a zigzag formation; and a housing portion which surrounds the spring portion, wherein the terminal portion, the spring portion and the housing portion are formed of a single sheet-metal plate by bending the single sheet-metal plate.

2. The probe according to claim 1, wherein the portion forming the housing portion in the single sheet-metal plate includes a portion forming a housing spring portion, and the probe further comprises the housing spring portion being disposed between the spring portion and the terminal portion.

3. The probe according to claim 1, further comprising a housing connecting portion connected to the terminal portion, and an electrical signal obtained from the terminal portion made to contact the electrode terminal is transmitted to the housing portion via the housing connecting portion., wherein the housing connecting portion connects between the terminal portion and the housing portion.

4. The probe according to claim 1, wherein the probe further includes a second terminal portion disposed at the other end of the probe, wherein, the second terminal portion is also formed of the single sheet-metal plate, and the portion forming the housing portion is disposed along the portion forming to the spring portion and extends in a longitudinal direction of the single sheet-metal plate.

5. The probe according to claim 1, wherein the spring portion is arranged to include a convex portion which projects toward the housing portion, the convex portion being in contact with an internal wall of the housing portion.

6. The probe according to claim 5, wherein the convex portion is arranged to include first and second convex portions formed on two opposing ones of the U-shaped unit portions of the spring portion, and a location of the first convex portion and a location of the second convex portion are symmetrical with respect to a centerline of the probe.

7. The probe according to claim 5, wherein the convex portion is disposed at a location of the spring portion in a vicinity of the terminal portion.

* * * * *